(12) United States Patent
Yang et al.

(10) Patent No.: US 11,990,185 B2
(45) Date of Patent: May 21, 2024

(54) DYNAMIC WORD LINE RECONFIGURATION FOR NAND STRUCTURE

(71) Applicant: SanDisk Technologies LLC, Addison, TX (US)

(72) Inventors: Xiang Yang, Santa Clara, CA (US); YenLung Li, San Jose, CA (US); James Kai, Santa Clara, CA (US)

(73) Assignee: SanDisk Technologies LLC, Austin, TX (US)

( * ) Notice: Subject to any disclaimer, the term of this patent is extended or adjusted under 35 U.S.C. 154(b) by 151 days.

(21) Appl. No.: 17/888,063

(22) Filed: Aug. 15, 2022

(65) Prior Publication Data

US 2024/0055051 A1    Feb. 15, 2024

(51) Int. Cl.
*G11C 16/08* (2006.01)
*G11C 16/04* (2006.01)
*G11C 16/10* (2006.01)
*G11C 16/16* (2006.01)

(52) U.S. Cl.
CPC .......... *G11C 16/08* (2013.01); *G11C 16/0483* (2013.01); *G11C 16/10* (2013.01); *G11C 16/16* (2013.01)

(58) Field of Classification Search
None
See application file for complete search history.

(56) References Cited

U.S. PATENT DOCUMENTS

| | | | |
|---|---|---|---|
| 8,913,431 B1 | 12/2014 | Costa et al. | |
| 8,923,053 B2 | 12/2014 | Han et al. | |
| 9,361,986 B2 | 6/2016 | Chen et al. | |
| 10,157,680 B2 | 12/2018 | Yang et al. | |
| 10,726,920 B2 | 7/2020 | Yang | |
| 11,287,989 B2 | 3/2022 | Mishra et al. | |
| 2005/0056869 A1* | 3/2005 | Ichige | H10B 43/30 257/E21.679 |
| 2014/0016413 A1 | 1/2014 | Han et al. | |

(Continued)

FOREIGN PATENT DOCUMENTS

WO    2012039511 A1    3/2012

OTHER PUBLICATIONS

U.S. Appl. No. 17/469,016, filed Sep. 8, 2021.

*Primary Examiner* — J. H. Hur
(74) *Attorney, Agent, or Firm* — Vierra Magen Marcus LLP

(57) ABSTRACT

Technology is disclosed herein reconfiguring word lines as either data word lines or dummy word lines. In a sub-block mode reconfigurable word lines are used as dummy word lines that provide electrical isolation between data word lines in a block. The block may be divided into an upper tier, a middle tier, and a lower tier, with the reconfigurable word lines within the middle tier. In a full-block mode the reconfigurable group of the word lines are used as data word lines. Because the reconfigurable word lines are used as data word lines in the full-block mode storage capacity is greater in the full-block mode than in the sub-block mode. Moreover, because the sub-blocks are smaller in size but greater in number than the full-blocks, the memory system may be provisioned with fewer blocks and still meet user storage requirements in both the full-block mode and the sub-block mode.

19 Claims, 23 Drawing Sheets

(56) References Cited

U.S. PATENT DOCUMENTS

| | | |
|---|---|---|
| 2014/0108705 A1 | 4/2014 | Gorobets |
| 2016/0026410 A1 | 1/2016 | Avila et al. |
| 2016/0179615 A1 | 6/2016 | Lee |
| 2016/0246673 A1 | 8/2016 | Kim |
| 2016/0322108 A1 | 11/2016 | Yang et al. |
| 2021/0295925 A1 | 9/2021 | Maeda |
| 2022/0068389 A1* | 3/2022 | Takekida ............... G11C 16/16 |

* cited by examiner

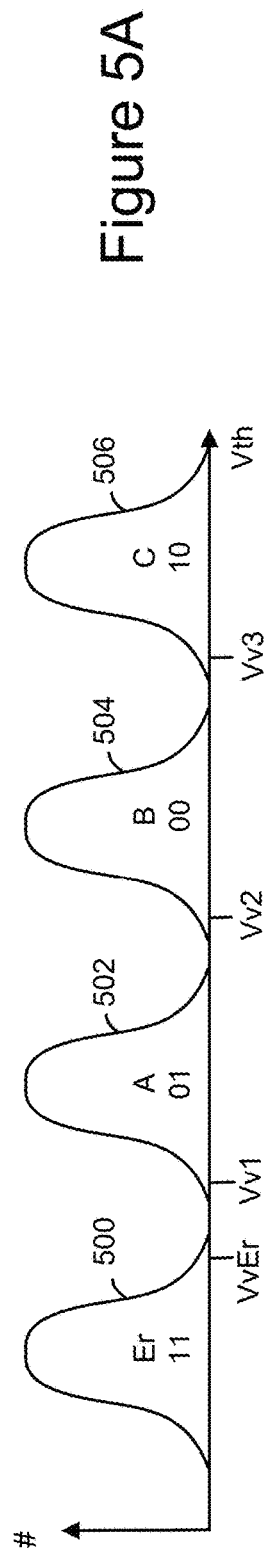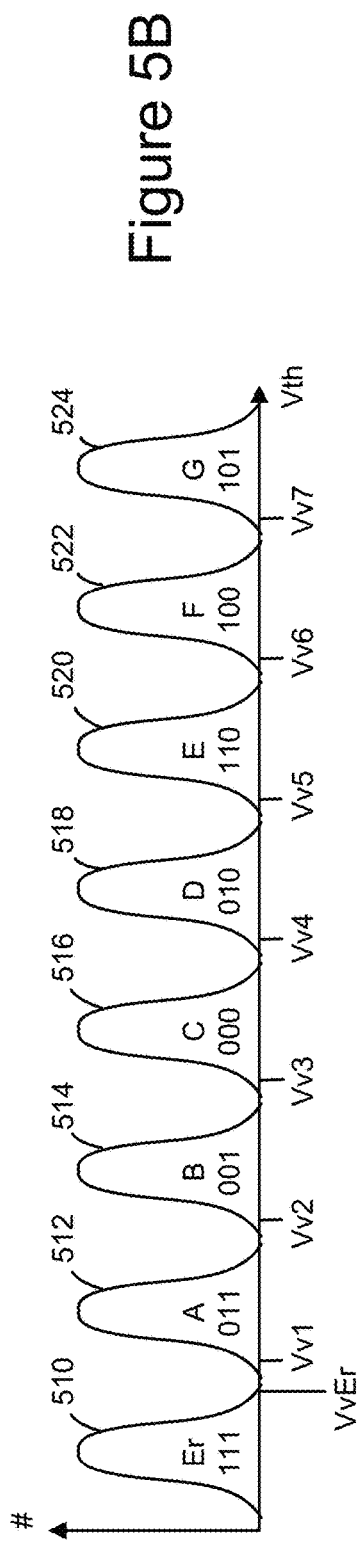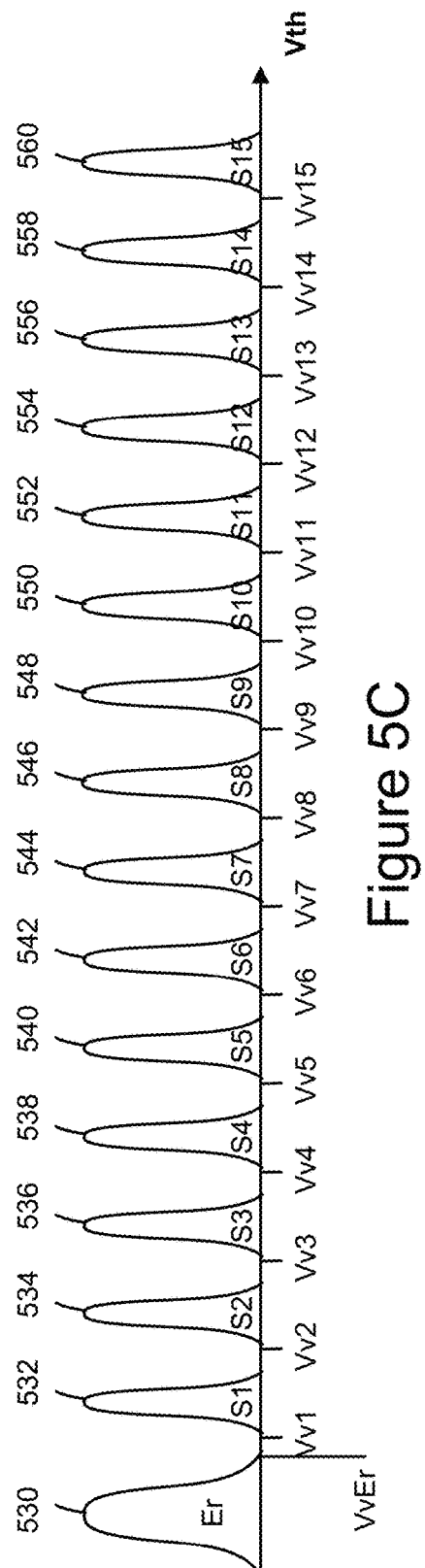

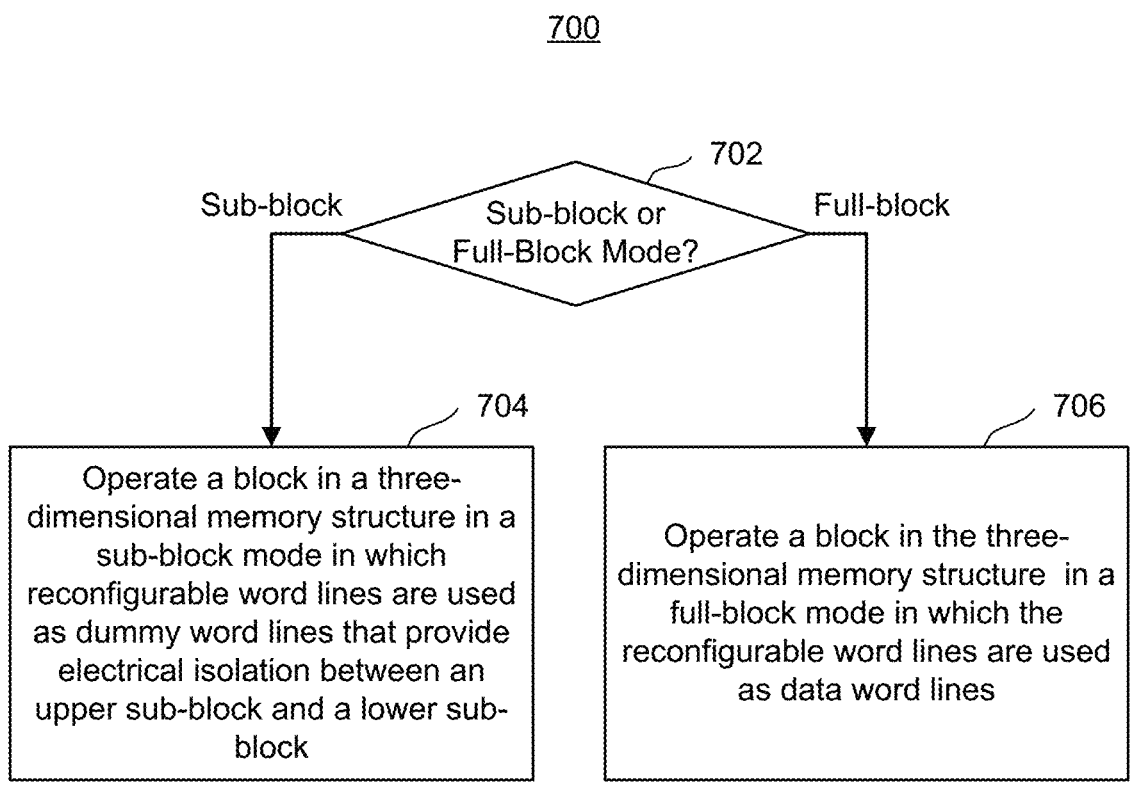

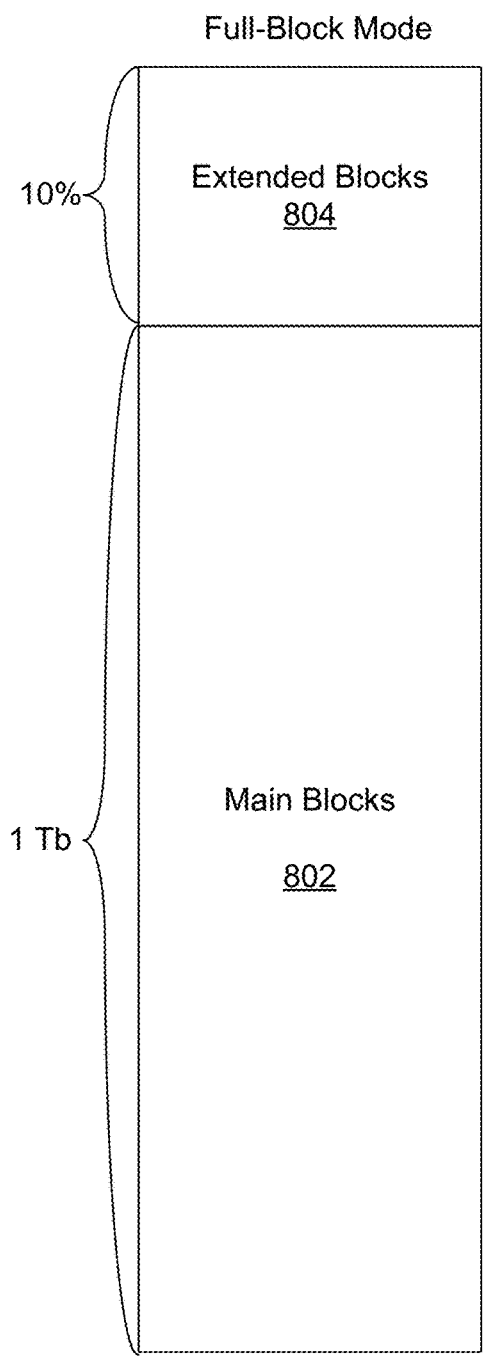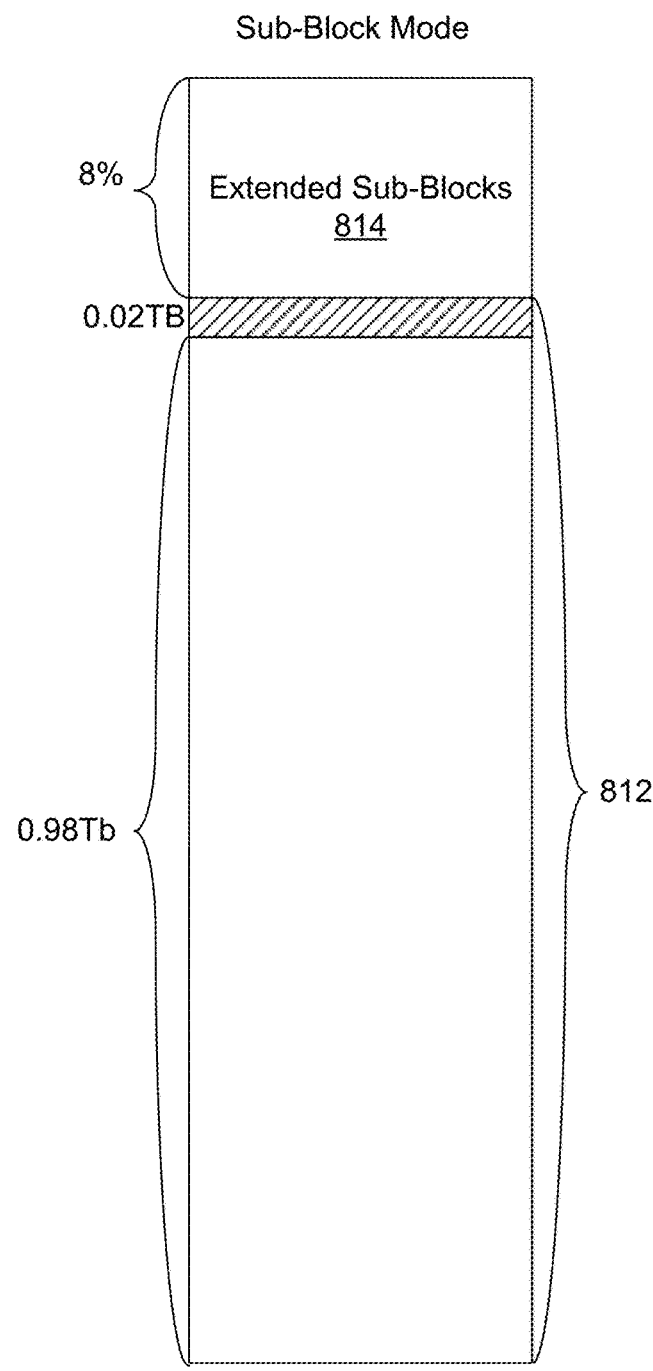

|  | Selected WL | | | | | | | |
|---|---|---|---|---|---|---|---|---|
|  | WL0 | WL89 | WL90 | WL133 | WL134 | WL177 | WL178 | WL267 |
| SGD | VSGD | VSGD | VSGD | VSGD | VSGD | VSGD | VSGD | VSGD |
| DD | VSG_P | VSG_P | VSG_P | VSG_P | VSG_P | VSG_P | VSG_P | VSG_P |
| WL267 | Vpass2 | Vpass2 | Vpass2 | Vpass2 | Vpass2 | Vpass2 | Vpass2 | VGPM |
| WL266 | Vpass2 | Vpass2 | Vpass2 | Vpass2 | Vpass2 | Vpass2 | Vpass2 | Vpass3 |
| WL265 | Vpass2 | Vpass2 | Vpass2 | Vpass2 | Vpass2 | Vpass2 | Vpass2 | Vpass1 |
| WL264 | Vpass2 | Vpass2 | Vpass2 | Vpass2 | Vpass2 | Vpass2 | Vpass2 | Vpass1 |
| ... | Vpass2 | Vpass2 | Vpass2 | Vpass2 | Vpass2 | Vpass2 | Vpass3 | Vpass1 |
| WL178 | Vpass2 | Vpass2 | Vpass2 | Vpass2 | Vpass2 | VPGM | VPGM | Vpass1 |
| IFDU2 | Vpass2 | Vpass2 | Vpass2 | Vpass2 | Vpass2 | Vpass2 | Vpass3 | Vpass1 |
| IFDL2 | Vpass2 | Vpass2 | Vpass2 | Vpass2 | Vpass2 | Vpass3 | Vpass1 | Vpass1 |
| WL177 | Vpass2 | Vpass2 | Vpass2 | Vpass2 | Vpass2 | VPGM | Vpass1 | Vpass1 |
| ... | Vpass2 | Vpass2 | Vpass2 | Vpass2 | Vpass3 | Vpass3 | Vpass1 | Vpass1 |
| WL134 | Vpass2 | Vpass2 | Vpass2 | Vpass2 | VPGM | Vpass1 | Vpass1 | Vpass1 |
| WL_RC4 | Vpass2 | Vpass2 | Vpass2 | Vpass2 | Vpass3 | Vpass1 | Vpass1 | Vpass1 |
| WL_RC3 | Vpass2 | Vpass2 | Vpass2 | Vpass2 | Vpass3 | Vpass1 | Vpass1 | Vpass1 |
| WL_RC2 | Vpass2 | Vpass2 | Vpass2 | Vpass3 | Vpass1 | Vpass1 | Vpass1 | Vpass1 |
| WL_RC1 | Vpass2 | Vpass2 | Vpass2 | Vpass3 | Vpass1 | Vpass1 | Vpass1 | Vpass1 |
| WL_133 | Vpass2 | Vpass2 | Vpass2 | VPGM | Vpass1 | Vpass1 | Vpass1 | Vpass1 |
| ... | Vpass2 | Vpass2 | Vpass3 | Vpass3 | Vpass1 | Vpass1 | Vpass1 | Vpass1 |
| WL90 | Vpass2 | Vpass2 | VPGM | Vpass1 | Vpass1 | Vpass1 | Vpass1 | Vpass1 |
| IFDU1 | Vpass2 | Vpass2 | Vpass3 | Vpass1 | Vpass1 | Vpass1 | Vpass1 | Vpass1 |
| IFDL1 | Vpass2 | Vpass3 | Vpass1 | Vpass1 | Vpass1 | Vpass1 | Vpass1 | Vpass1 |
| WL89 | Vpass2 | VPGM | Vpass1 | Vpass1 | Vpass1 | Vpass1 | Vpass1 | Vpass1 |
| ... | Vpass2 | Vpass3 | Vpass1 | Vpass1 | Vpass1 | Vpass1 | Vpass1 | Vpass1 |
| WL1 | Vpass3 | Vpass1 | Vpass1 | Vpass1 | Vpass1 | Vpass1 | Vpass1 | Vpass1 |
| WL0 | VPGM | Vpass1 | Vpass1 | Vpass1 | Vpass1 | Vpass1 | Vpass1 | Vpass1 |
| DDS | VSG_P | VSG_P | VSG_P | VSG_P | Vpass1 | Vpass1 | Vpass1 | Vpass1 |
| SGS | VSGS | VSGS | VSGS | VSGS | VSGS | VSGS | VSGS | VSGS |

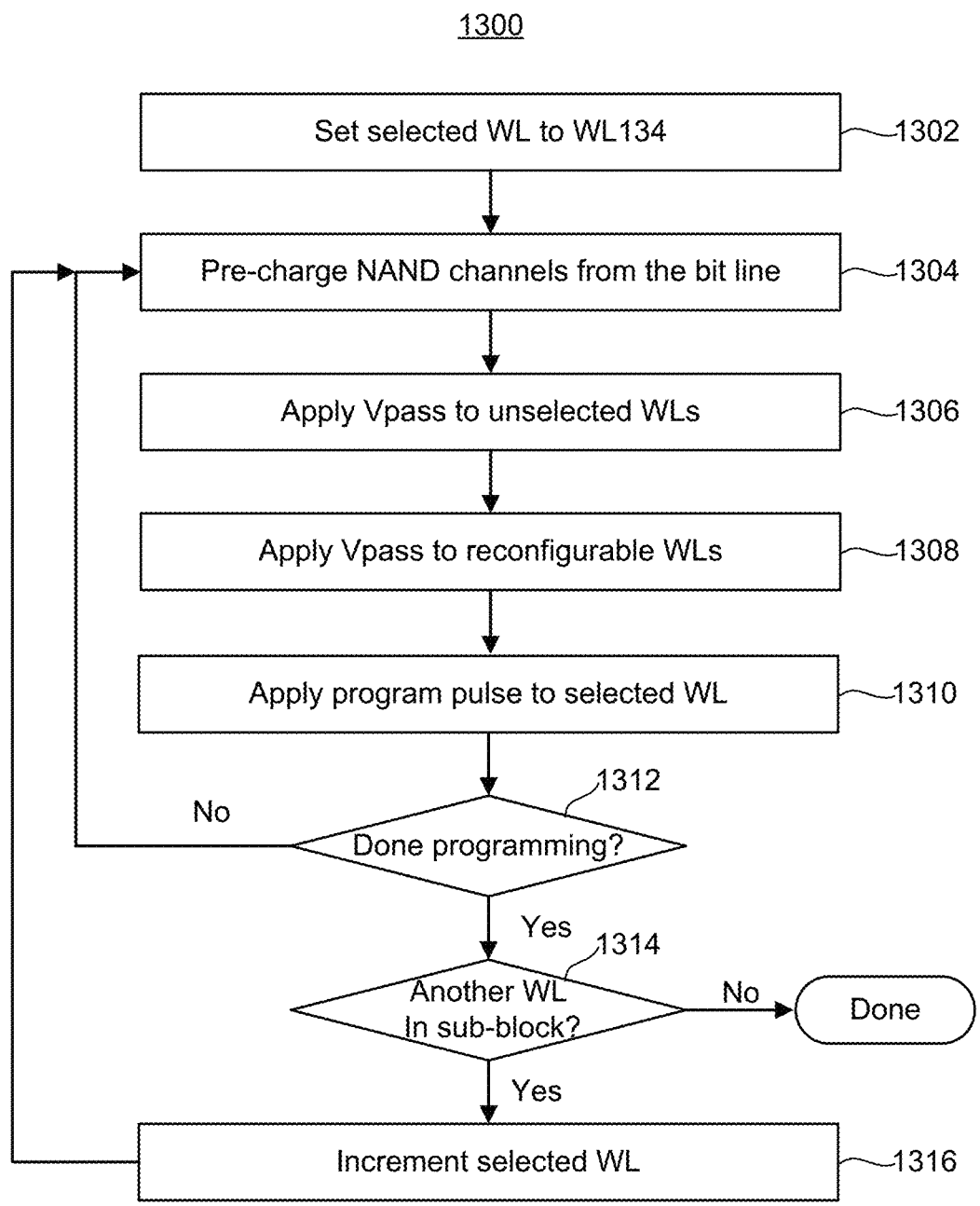

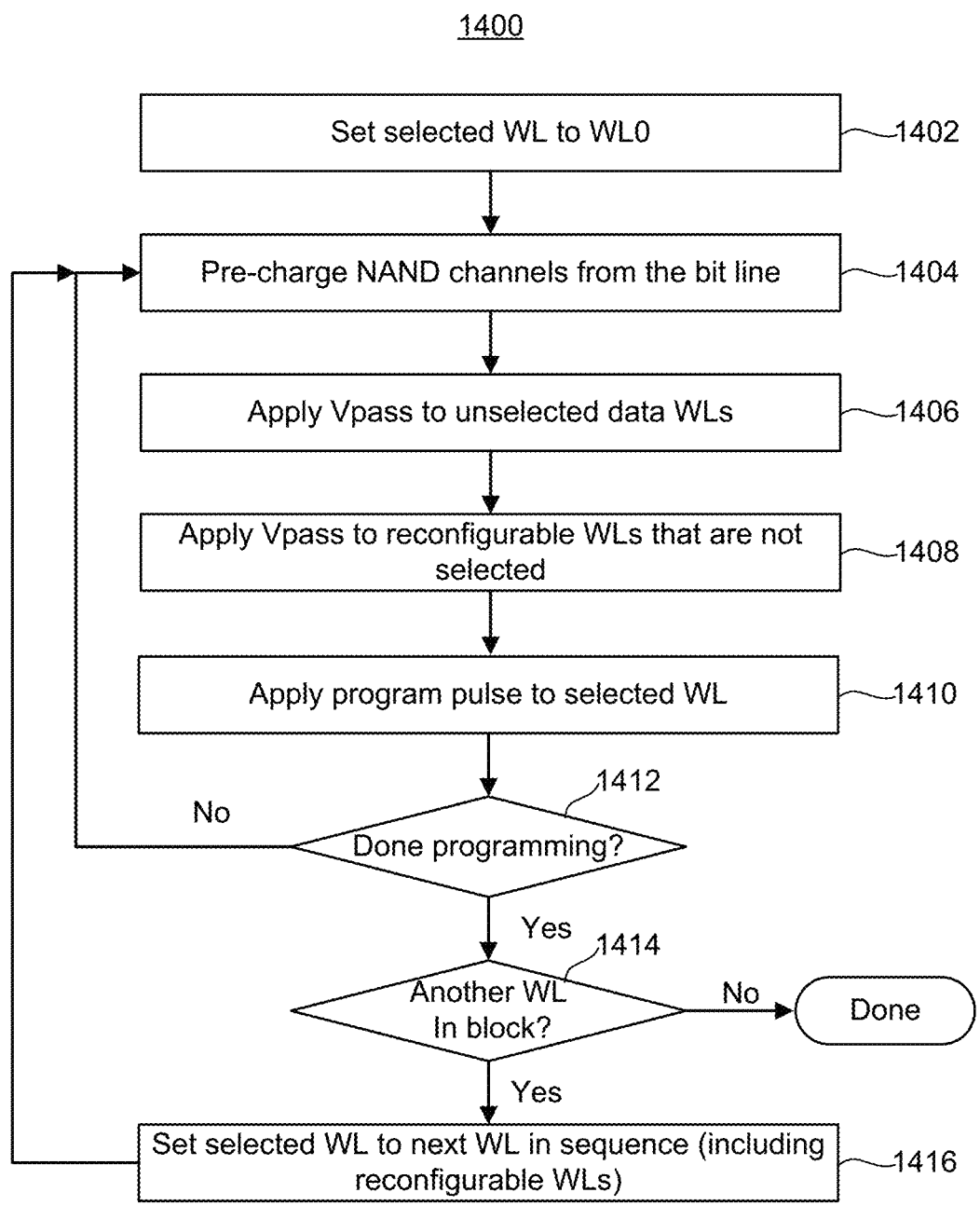

DYNAMIC WORD LINE RECONFIGURATION FOR NAND STRUCTURE

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

BRIEF DESCRIPTION OF THE DRAWINGS

Like-numbered elements refer to common components in the different figures.

FIGS. 5A, 5B and 5C depict threshold voltage distributions.

FIG. 7 is a flowchart of one embodiment of a process of operating a block in either a sub-block mode or a full-block mode.

FIG. 8A depicts provisioning of blocks in a full-block mode.

FIG. 8B depicts provisioning of blocks in a sub-block mode.

FIG. 12 depicts a table describing biasing conditions applied to word lines during programming in one embodiment of a sub-block mode.

FIG. 13A is a flowchart of one embodiment of a process of programming memory cells in an upper sub-block.

FIGS. 14A and 14B are flowcharts of embodiments of programming memory cells in a full-block mode.

DETAILED DESCRIPTION

Technology is disclosed herein for reconfiguring word lines as either data word lines or dummy word lines. The memory cells connected to data word lines are referred to herein as data memory cells. The memory cells connected to dummy word lines are referred to herein as dummy word lines. A data memory cell is eligible for programming data, which could be user data or system data. A dummy memory cell is not eligible for programming user data or system data. In one embodiment, the word lines in a block comprise a first set of data word lines, a second set of data word lines and reconfigurable word lines between the first set and the second set. In one embodiment, the memory system operates the memory structure in a sub-block mode in which the reconfigurable word lines are used as dummy word lines that provide electrical isolation between the first set of data word lines and the second set of data word lines in the first block. For example, there may be two sub-blocks with the first set of data word lines in a lower sub-block and the second set of data word lines in an upper sub-block. The memory system operates the memory structure in a full-block mode in which the reconfigurable word lines are used as data word lines. Because the reconfigurable word lines may be used as data word lines when in the full-block mode, storage capacity is greater in the full-block mode than in the sub-block mode. Moreover, because the sub-blocks are smaller in size but greater in number than the full-blocks, the memory system may be provisioned with fewer blocks and still meet user storage requirements in both the full-block mode and the sub-block mode. Furthermore, pre-charging of NAND channels during a program operation is facilitated by having an upper sub-block that is pre-charged from a bit line and a lower sub-block that is pre-charged from a source line.

In an embodiment, each block has an upper tier, a middle tier, and a lower tier, with each tier containing a different section of each NAND string. The lower tier and the middle tier may be separated by a first interface layer having a first set of fabrication joints. The middle tier and the upper tier may be separated by a second interface layer having a second set of fabrication joints. There may be dummy word lines that are adjacent to each interface layer. These dummy word lines may be operated as dummy word lines in both the full block mode and the sub-block mode. In an embodiment, the NAND strings are formed in memory holes, with each fabrication joint providing an electrical connection between a NAND channel in one tier with a NAND channel in another tier. Therefore, the NAND strings may extend from the lower tier to the upper tier. The reconfigurable group of the word lines may reside within the middle tier.

Figure 1:
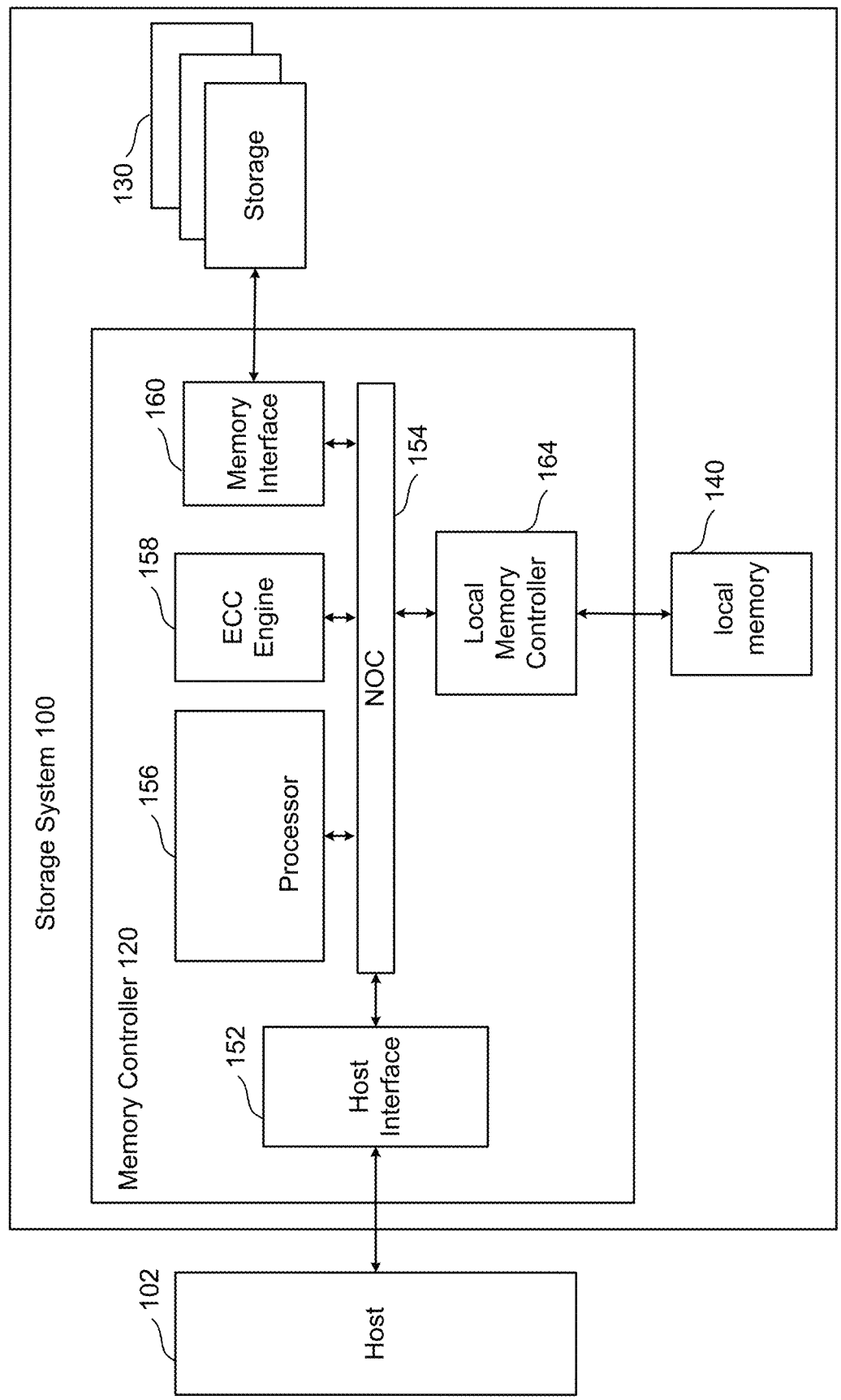
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
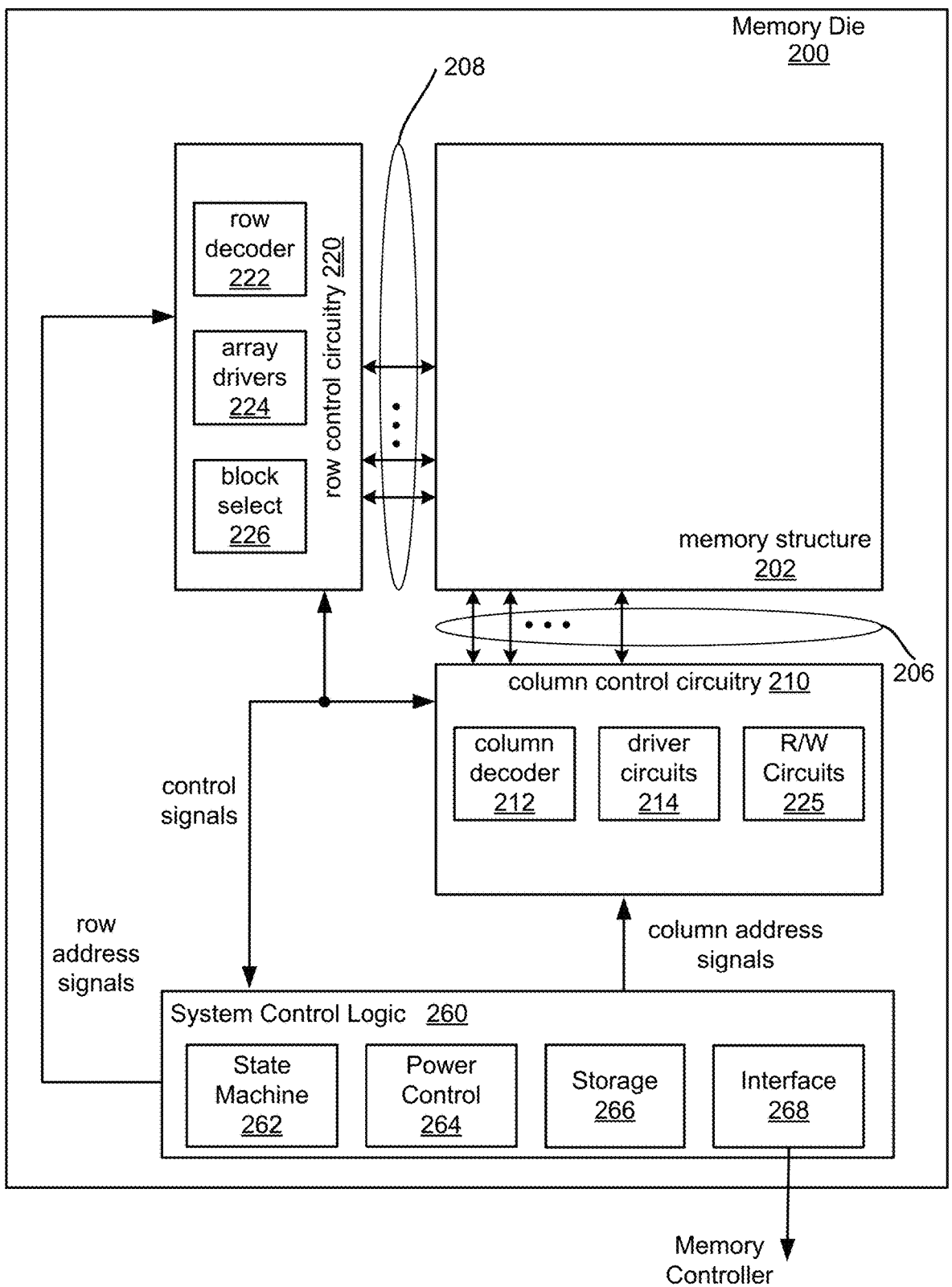
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
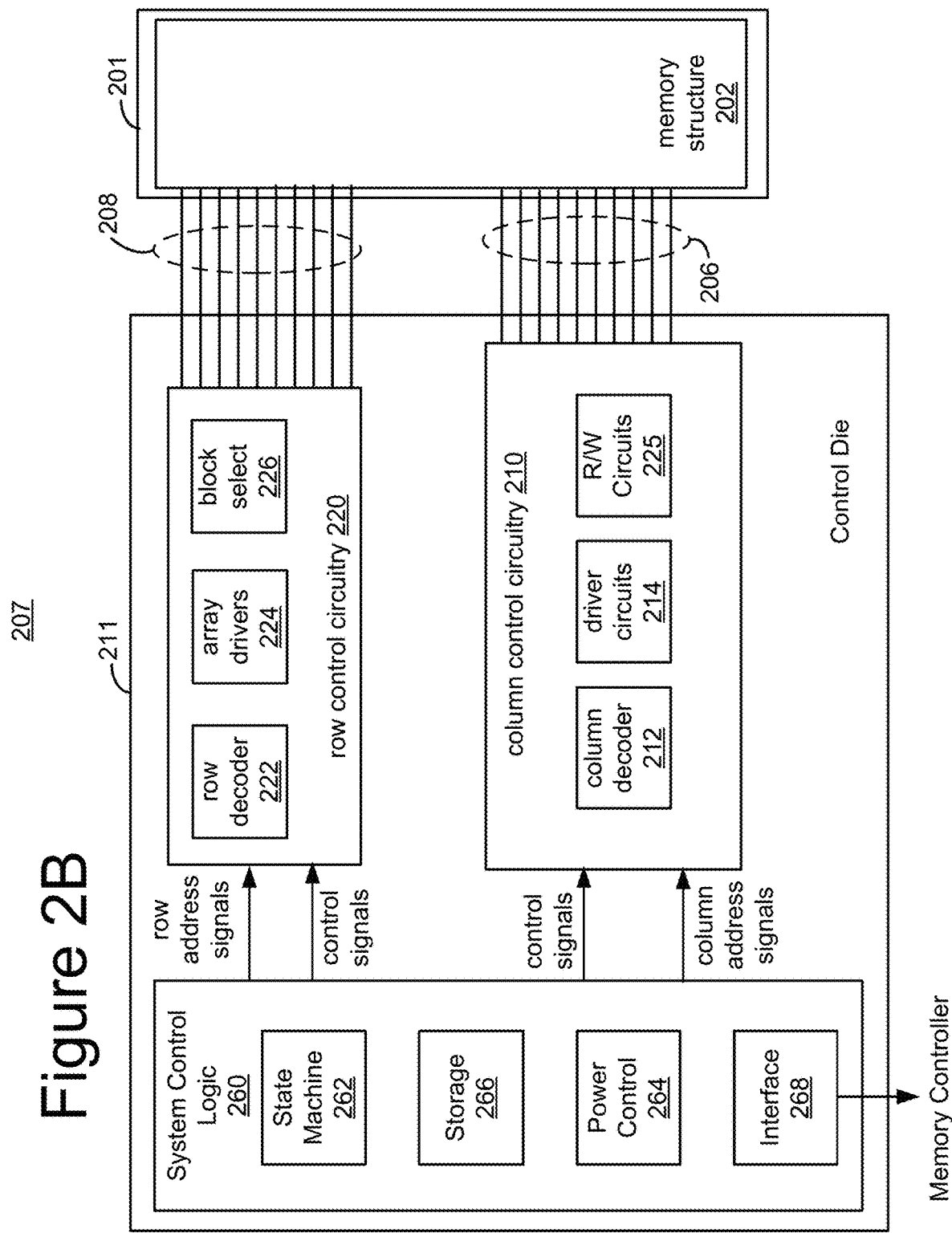
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
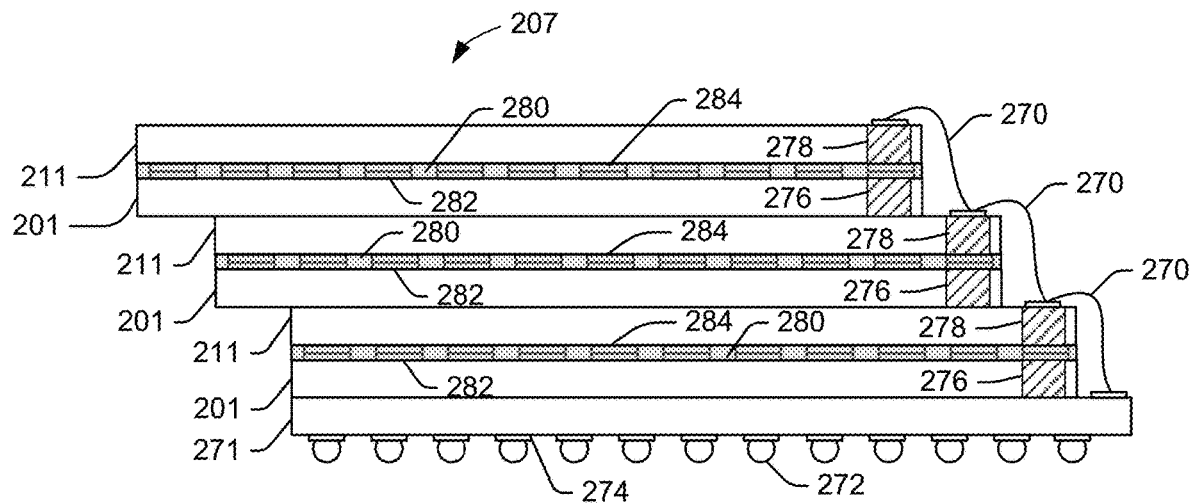
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
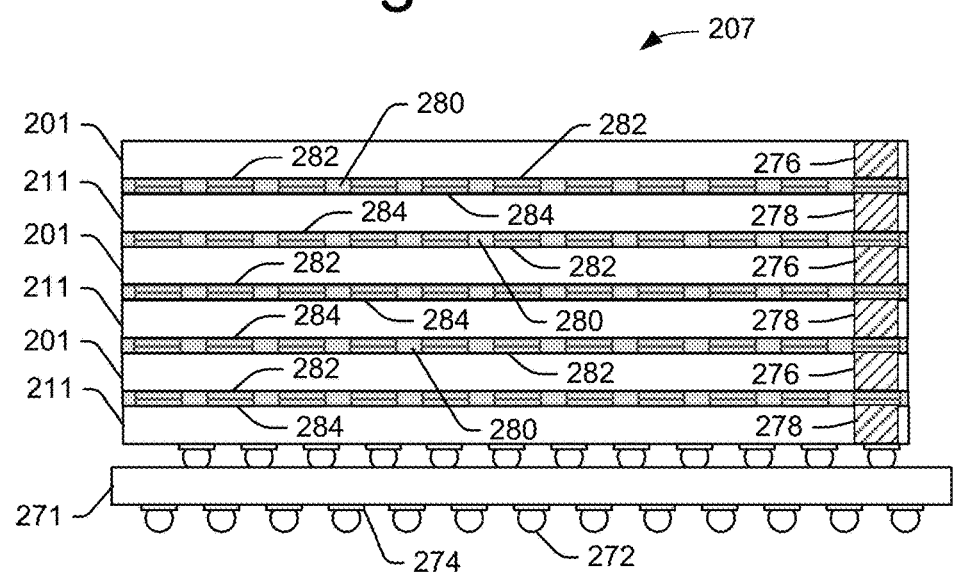

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
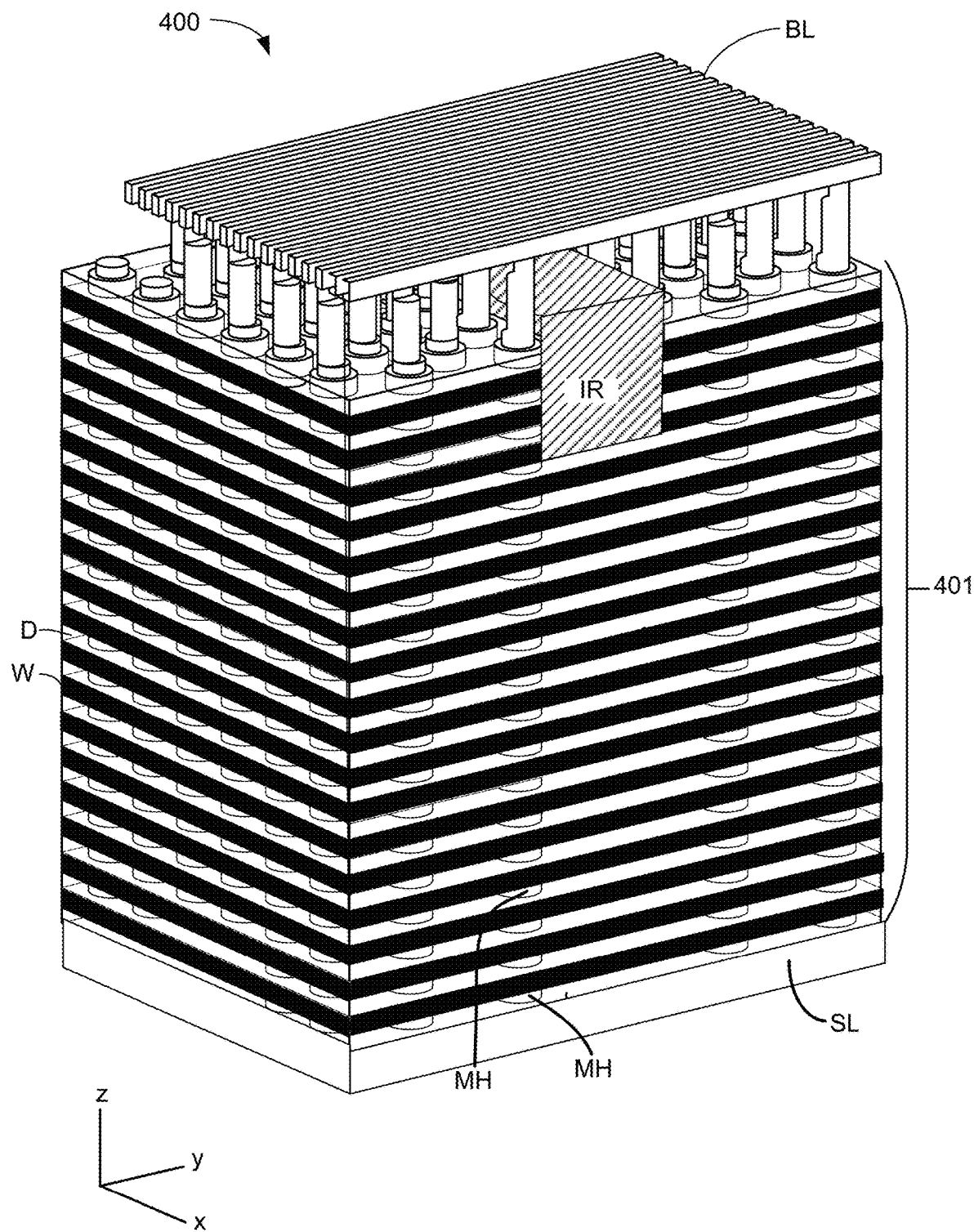
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., fingers or strings) by isolation regions IR. FIG. 4 shows one isolation region IR separating two fingers. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
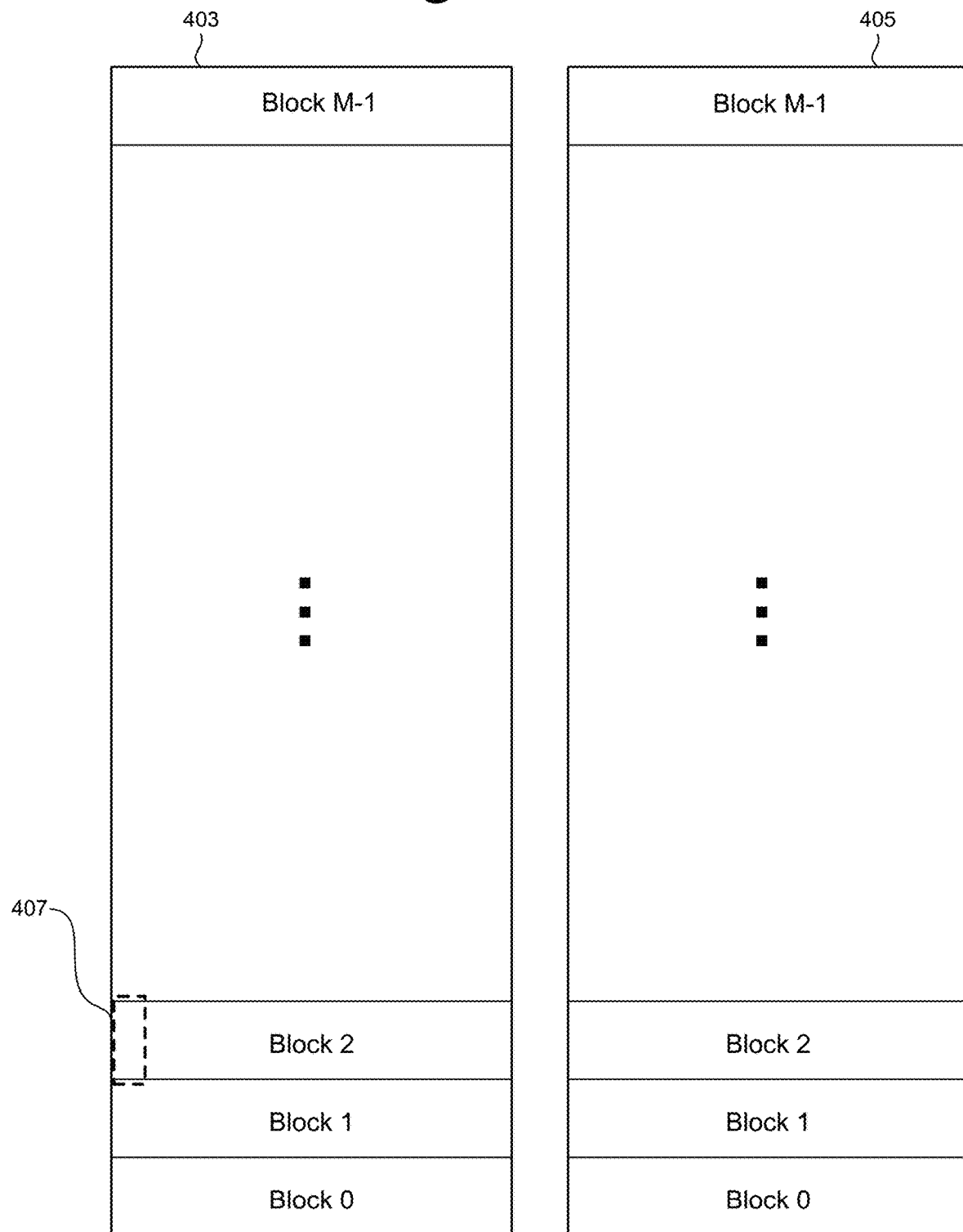
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment of a full-block mode, a block of memory cells is a unit of erase. That is, all memory cells of a block are erased together. In one embodiment of a sub-block mode, blocks can be divided into sub-blocks and the sub-blocks are the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
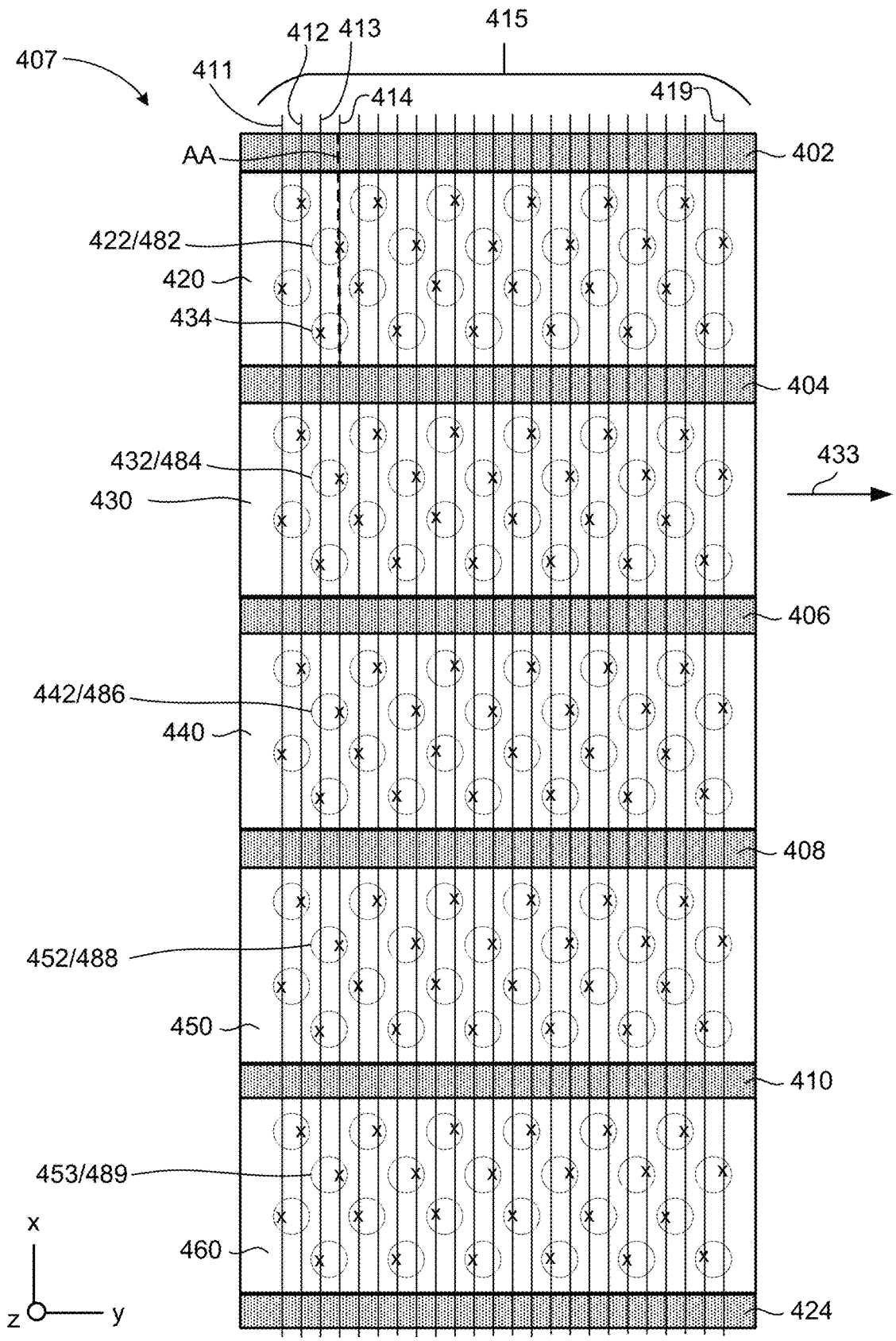
FIG. 4B is a block diagram depicting a top view of a portion of block of memory cells.

FIGS. 4B and 4D-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as fingers. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different fingers can be independently selected. Referring back to FIG. 4, the IR region may correspond to any of isolation regions 404, 406, 408 or 410. In one example implementation, a bit line only connects to one vertical column/NAND string in each of regions (fingers) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
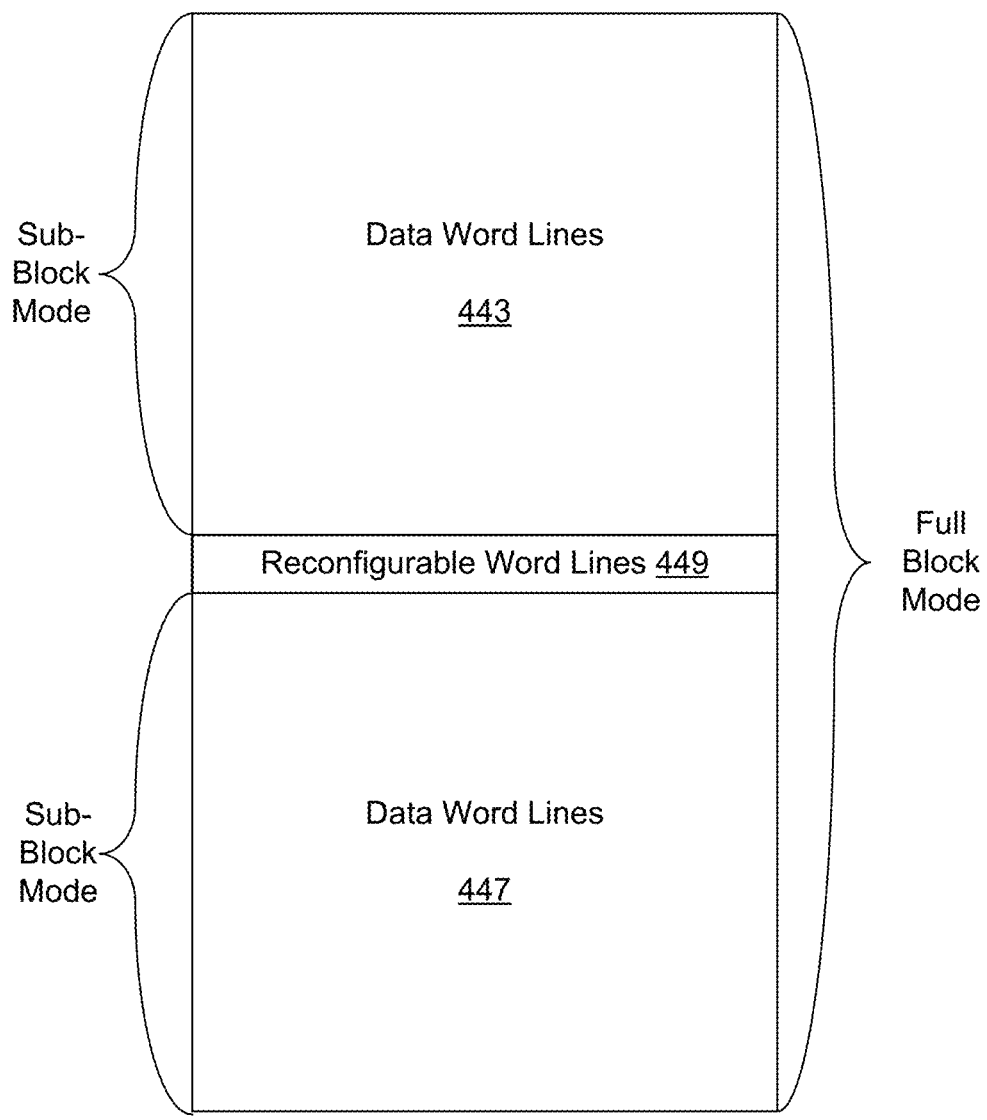
FIG. 4C depicts one embodiment of a block that has data word lines and reconfigurable word lines.

FIG. 4C depicts one embodiment of a block 444 that has data word lines and reconfigurable word lines. The block 444 may represent, for example, Block 2 in FIG. 4A. The block 444 has a first set of data word lines 443, a second set of data word lines 447, and reconfigurable word lines 449. The first set of data word lines 443 are in one region of the block 444, the second set of data word lines 443 are in another region of the block 444, and the reconfigurable word lines 449 are between and divide the first and second sets of data word lines.

The reconfigurable word lines may be used as data word lines in a full-block mode and as dummy word lines in a sub-block mode. There may be additional dummy word lines in the block 444; however, those dummy word lines are not depicted din FIG. 4C. Data may be programmed into the reconfigurable word lines 449 when in the full block mode. However, data is not programmed into the reconfigurable word lines 449 when in the sub-block mode. Therefore, the reconfigurable word lines allow for additional storage capacity in the full-block mode. For example, in the full block mode all of the first set of data word lines 443, the second set of data word lines 447, and the reconfigurable word lines 449 may be used for data storage.

In an embodiment, memory cells connected to the first set of data word lines 443, memory cells connected to the second set of data word lines 447, and memory cells connected to the reconfigurable word lines 449 are erased as a unit in the full-block mode. However, in the sub-block mode memory cells connected to the first set of data word lines 443 are erased independent of memory cells connected to the second set of data word lines 447. Moreover, the reconfigurable word lines provide electrical isolation between the first set of data word lines 443 and the second set of data word lines 447 in the sub-block mode. In an embodiment, the voltage applied to the reconfigurable word lines 449 during erase in the sub-block mode enables the reconfigurable word lines to provide electrical isolation between the first set of data word lines 443 and the second set of data word lines 447.

Figure 4D:
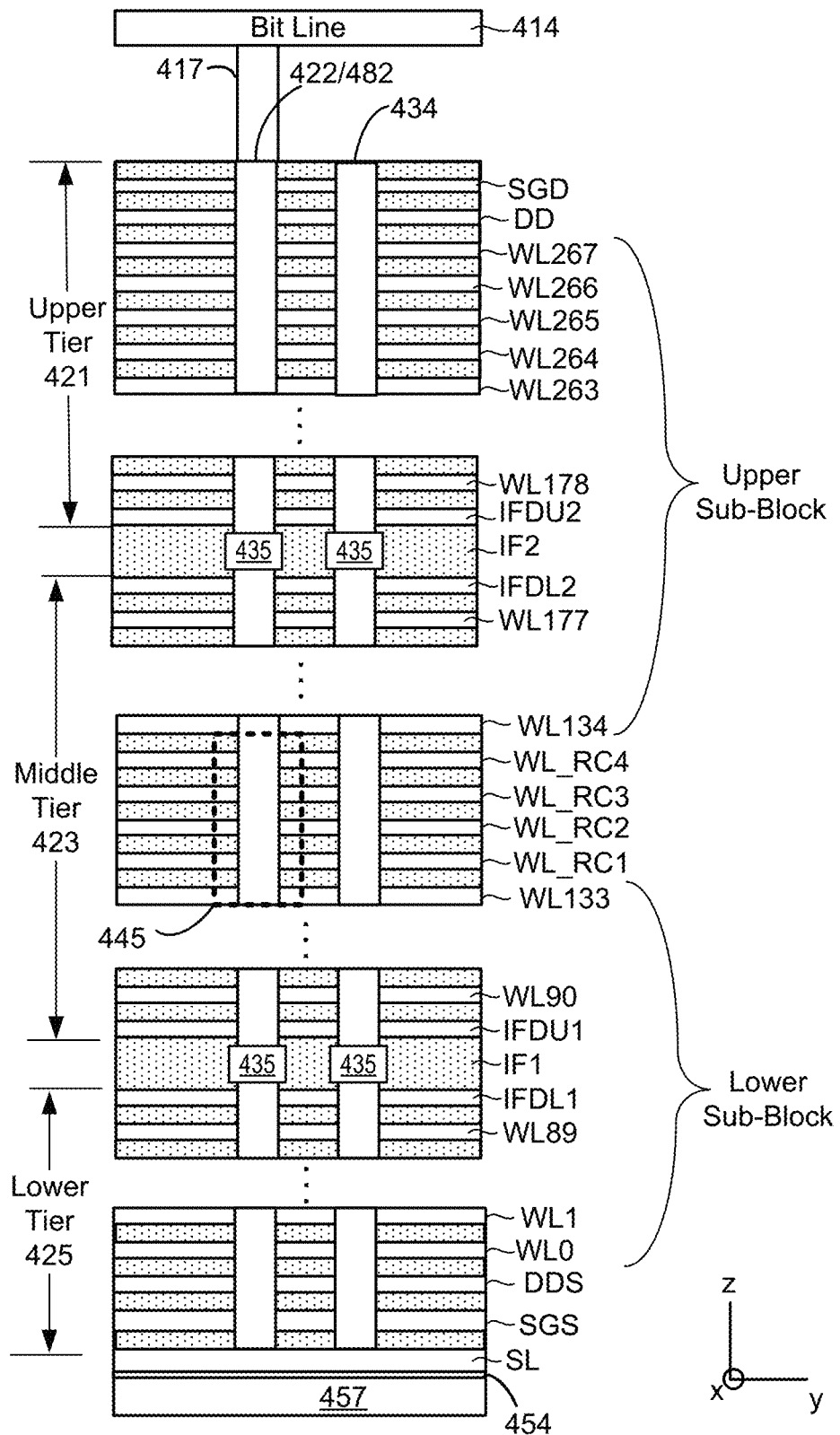
FIG. 4D depicts an embodiment of a stack showing a cross-sectional view along line AA of FIG. 4B.

FIG. 4D depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). FIG. 4D depicts an embodiment of a stack having three tiers. The three-tier stack comprises an upper tier 421, middle tier 423, and a lower tier 425. The memory holes in the lower tier 425 and the middle tier 423 may be joined by fabrication joints 435. Likewise, the memory holes in the upper tier 421 and the middle tier 423 may be joined by fabrication joint 435. A fabrication joint is configured to provide an electrical connection between the channel of a section of NAND string in one tier with the channel of a section of NAND string in an adjacent tier. A fabrication joint may contain a conductive region such as doped silicon or Tungsten in order to provide this electrical connection. The fabrication joints 435 reside in an interface layer IF1 or IF2. The interface layers IF1, IF2 may contain an insulator such as silicon oxide in addition to the fabrication joints 435. In some embodiments, a fabrication joint 435 contains a junction transistor that is able to provide the electrical connection between the channel of a section of NAND string in one tier with the channel of a section of NAND string in an adjacent tier. In this case, each respective interface layer (IF1, IF2) may contain a conductive layer to drive the gates of the junction transistors.

A three-tier other multi-tier stack can be used to form a relatively tall stack while maintaining a relatively narrow memory hole width (or diameter). After the layers of the lower tier 425 are formed, memory hole portions are formed in the lower tier 425. After the layers of the middle tier are formed, memory hole portions are formed in the middle tier. After the layers of the upper tier are formed, memory hole portions are formed in the upper tier. The memory holes of the upper tier are aligned with the memory holes of the middle tier and the upper tier and middle tier are joined together. In an embodiment a fabrication joint 435 connects a memory hole of the upper tier with a memory hole in the middle tier. The memory holes of the lower tier are aligned with the memory holes of the middle tier and the lower tier and middle tier are joined together. In an embodiment a fabrication joint 435 connects a memory hole of the middle tier with a memory hole in the lower tier. Therefore, the respective fabrication joints 435 may provide a conductive connection between the NAND channels in one tier with the NAND channels in another tier. Thus, the NAND strings will extend continuously through the three tiers. Hence, NAND strings may extend from one end of the stack to the other.

The resulting memory hole is narrower than would be the case if the memory hole was etched from the top to the bottom of the stack rather than in each tier individually. The interface layers (IF1, IF2) are created where each pair of tiers are connected. Due to the presence of the interface layers, the adjacent word line layers may suffer from edge effects such as difficulty in programming or erasing. These adjacent word line layers can therefore be set as dummy word lines (IFDL1, IFDU1, IFDL2, IFDU2). In an embodiment, the memory system operates the dummy word lines (IFDL1, IFDU1, IFDL2, IFDU2) as dummy word lines in both the full-block mode and the sub-block mode.

The structure of FIG. 4D also includes a drain side select gate layer (SGD) and a source side select gate layer (SGS). There may be multiple SGD layers as well as multiple SGS layers. The structure of FIG. 4D also includes dummy word line layers DD, DDS; two hundred sixty eight data word line layers WL0-WL267 for connecting to data memory cells. Dielectric layers are depicted between the conductive layers just described. Other embodiments can implement more or fewer than the numbers described above for FIG. 4D.

The middle tier 423 has a number of reconfigurable word line layers WL_RC1, WL_RC2, WL_RC3, and WL_RC4. Each reconfigurable word line layers connects to memory cells that are reconfigurable as either data memory cells or dummy memory cells. Thus, each of these layers may be configured as either a data word line layer or a dummy word line layer. In an embodiment, the reconfiguration is performed by memory controller 120 by, for example, designating the reconfigurable word line layers as either dummy WLs or data WLs. In an embodiment, the reconfigurable word line layers are configured as dummy word lines when in a sub-block mode. Stated another way the memory cells connected to the reconfigurable word line layers may be operated as either data memory cells or dummy memory cells.

In the sub-block mode, the upper sub-block and the lower sub-block may be erased independently of each other. Hence, data may be maintained in the upper sub-block after the lower sub-block is erased. Likewise, data may be maintained in the lower sub-block after the upper sub-block is erased. The reconfigurable word line layers may provide electrical isolation between the upper sub-block and the lower sub-block in the sub-block mode. In an embodiment, the reconfigurable word line layers are configured as data word lines when in a full-block mode. Therefore, the capacity of the block may be greater in the full-block mode relative to the capacity of the combined upper and lower sub-block capacity in the sub-block mode. In the example, in FIG. 4D, the lower sub-block includes data word lines WL0-WL133 and the upper sub-block includes data word lines WL134-WL267. Therefore, each sub-block contains 134 data word lines. Combined the two sub-blocks have 268 data word lines in the sub-block mode. However, in the full-block mode the four reconfigurable word lines bring the total to 272 data word lines. Therefore, the full-block mode has greater storage capacity than the sub-block mode. Note that the sub-block mode in which there is an upper sub-block and a lower sub-block may also be referred to as a half-block mode. Also, a full-block mode can also be referred to as a full NAND string mode and a half-block mode can also be referred to as a half NAND string mode. However, the half-block mode has less than half the storage capacity of the full-block mode due to the reconfigurable word lines being used as dummy word lines in the half-block mode and as data word lines in the full-block mode. The term "half-block" is used to describe that there are two sub-blocks in the block.

Vertical columns 432 and 434 are depicted protruding through the drain side select layer, source side select layer, IF layers, dummy word line layers, reconfigurable word line layers and data word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4D shows vertical column 432 connected to bit line 414 via connector 417.

For ease of reference, drain side select layer, source side select layer, dummy word line layers, data word line layers, and reconfigurable word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W267 connect to memory cells (also called data memory cells). Dummy word line layers DD and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS are used to electrically connect and disconnect (or cut off) the channels of respective NAND strings from the source line SL.

Figure 4E:
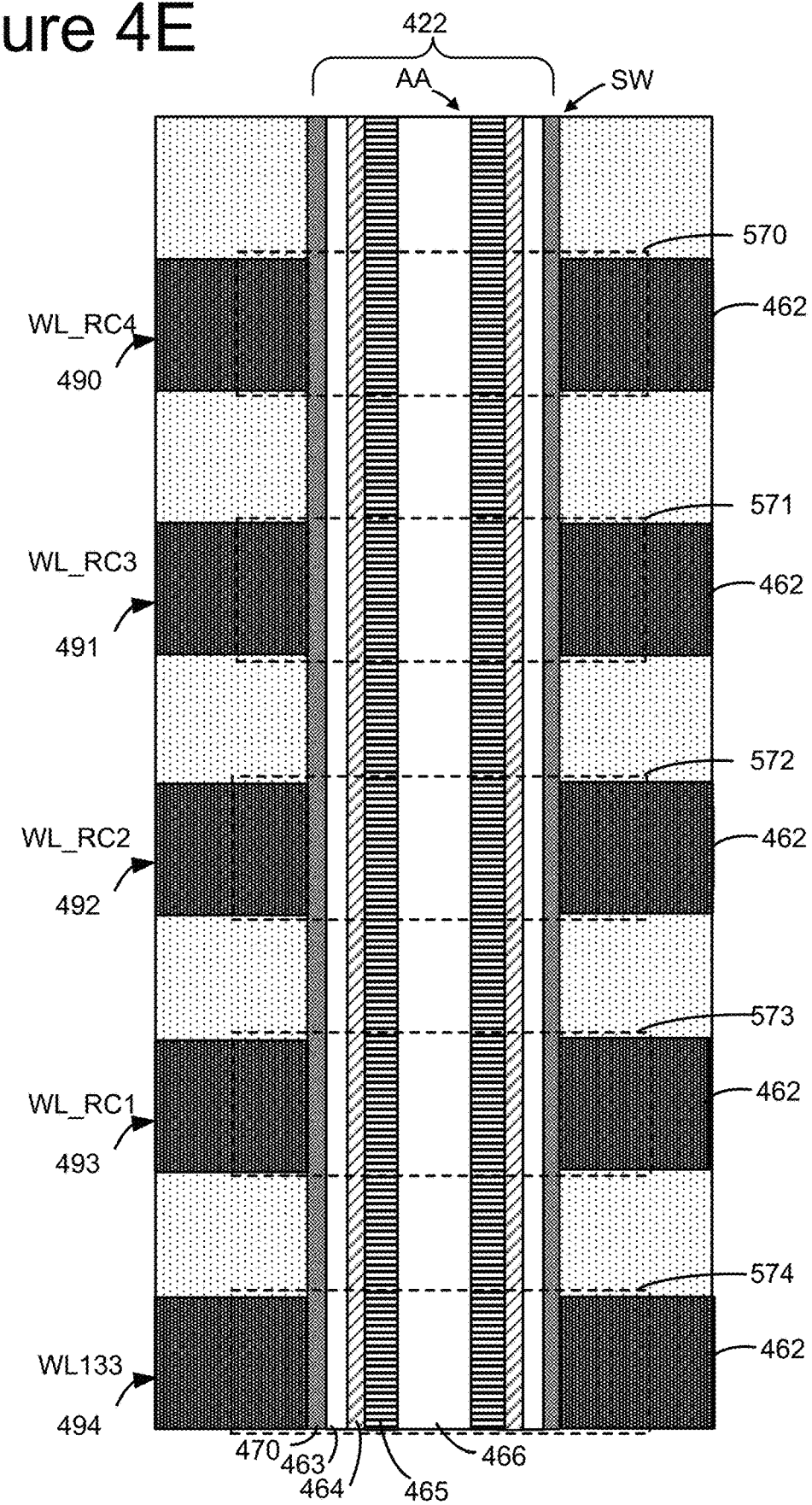
FIG. 4E depicts a view of the region 445 of FIG. 4D.

FIG. 4E depicts a view of the region 445 of FIG. 4D. Included are WL133, WL_RC1, WL_RC2, WL_RC3, and WL_RC4. Reconfigurable memory cell transistors 570, 571, 572, and 573, as well as data memory cell transistor 574 are indicated by the dashed lines. Physically, the reconfigurable memory cell transistors and the data memory cell transistor 574 may have the same structure. The reconfigurable memory cell transistors 570, 571, 572, and 573 may, in one mode, be configured as data memory cell transistors. In another mode, the reconfigurable memory cell transistors 570, 571, 572, and 573 may be configured as data memory cell transistors. In one embodiment, the reconfiguration is performed by memory controller 120, which changes how the reconfigurable memory cell transistors are designated for use. Thus, the reconfiguration does not require a physical change to the reconfigurable memory cell transistors 570.

A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell transistor is programmed, electrons are stored in a portion of the charge-trapping layer which is associated with the memory cell transistor. These electrons are drawn into the charge-trapping layer from the channel, and through the tunneling layer. The Vth of a memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
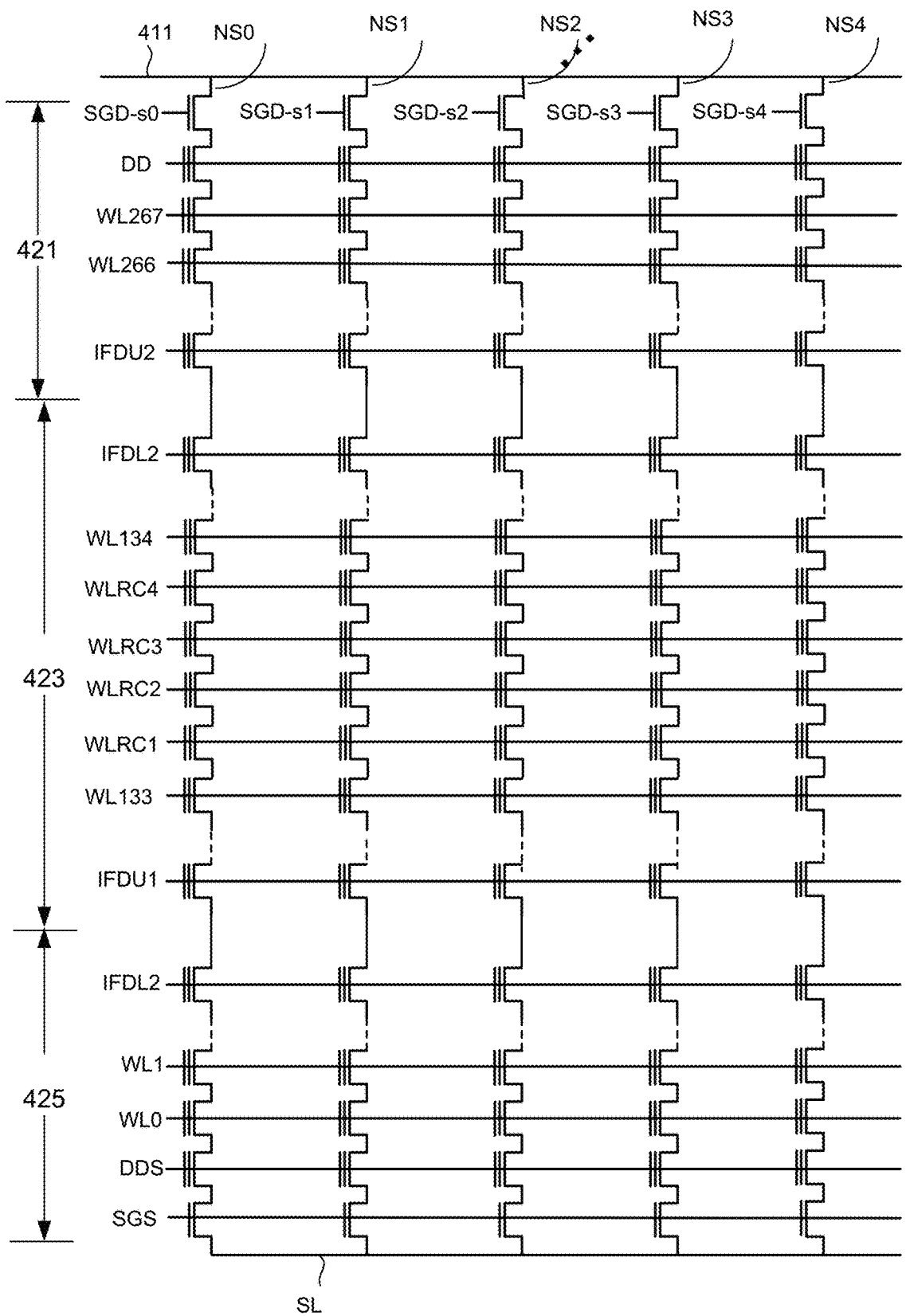
FIG. 4F is a schematic diagram of a portion of one embodiment of a block, depicting several NAND strings.

FIG. 4F is a schematic diagram of a portion of the memory depicted in in FIGS. 4-4E. FIG. 4F shows physical word lines WL0-WL267 running across the entire block. The structure of FIG. 4F corresponds to portion 407 in Block 2 of FIGS. 4A-4B, including bit lines 411, 412, 413, 414, . . . 419. Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connects to the associated bit line. Other NAND strings of the block and other bit lines are not depicted in FIG. 4F. A first finger corresponds to those vertical NAND strings controlled by SGD-s0. A second finger corresponds to those vertical NAND strings controlled by SGD-s1. A third finger corresponds to those vertical NAND strings controlled by SGD-s2. A fourth finger corresponds to those vertical NAND strings controlled by SGD-s3. A fifth finger corresponds to those vertical NAND strings controlled by SGD-s4. There may be more or fewer than five fingers in a block.

A source side selection line SGS connects/disconnects the NAND strings to/from the common source line. In some embodiments, there is a source side selection line for each finger (similar to the five SGD-s0, SGD-s1, SGD-s2, SGD-s3 and SGD-s4). The block can also be thought of as divided into five fingers: Finger 0, Finger 1, Finger 2, Finger 3, Finger 4. Finger 0 corresponds to those vertical NAND strings controlled by SGD-s0, Finger 1 corresponds to those vertical NAND strings controlled by SGD-s1, Finger 2 corresponds to those vertical NAND strings controlled by SGD-s2, Finger 3 corresponds to those vertical NAND strings controlled by SGD-s3, and Finger 4 corresponds to those vertical NAND strings controlled by SGD-s4. Note that the term "finger" in this context refers to regions that each contain entire NAND strings (but a subset of NAND strings in the block). In some embodiments, there is a sub-block mode in which each sub-block contains only a portion of each NAND string. For example an upper sub-block may contain an upper half of each NAND string in the block and a lower sub-block may contain a lower half of each NAND string in the block. With respect to the example in FIG. 4F, the sub-blocks may be divided by the reconfigurable word lines (WLRC1, WLRC2, WLRC3, WLRC4), which reside in the middle tier 423. Therefore, the lower sub-block may contain data word lines WL0-WL133 and the upper sub-block may contain data word liens WL134-WL267.

Although the example memories of FIGS. 4, 4B and 4D-4F are three dimensional memory structure that includes vertical NAND strings with charge-trapping material, other memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

Figure 6:
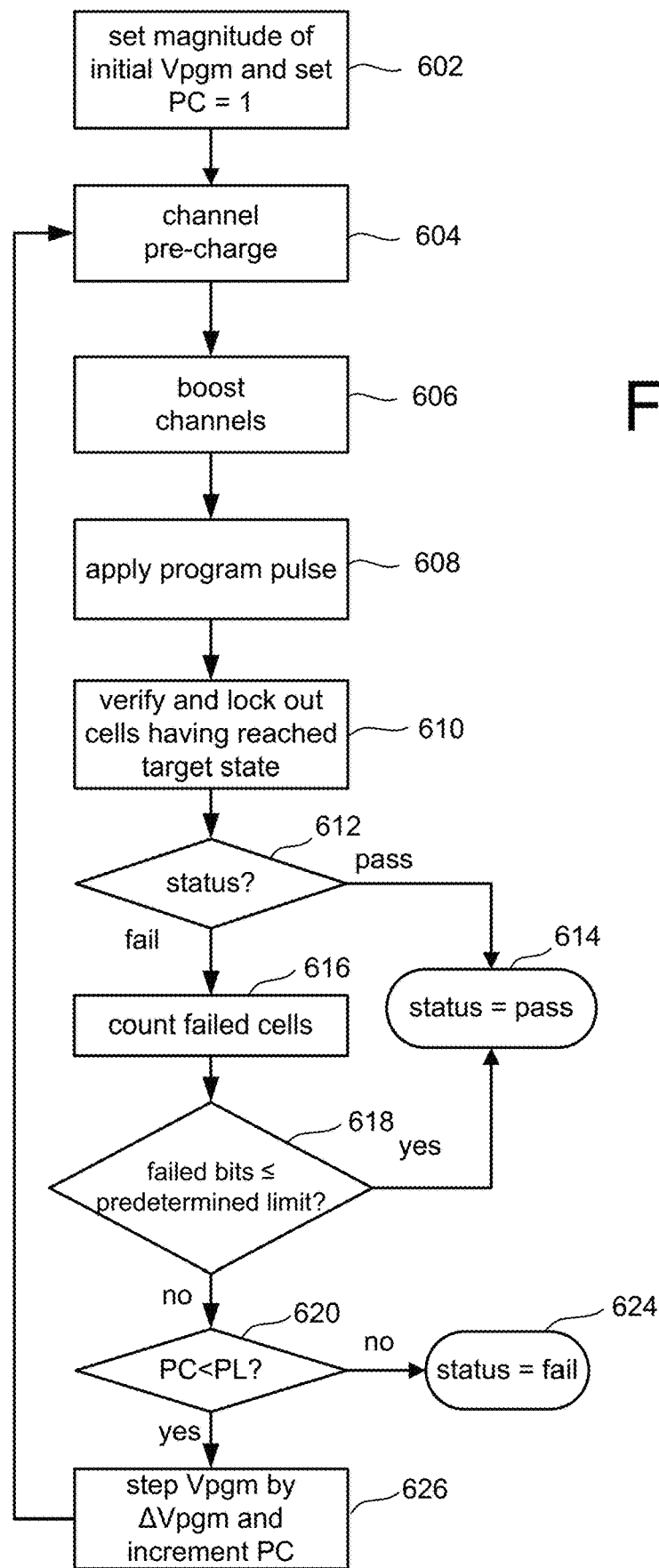
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

Technology is disclosed herein for reconfiguring word lines to operate as dummy word lines in a sub-block mode and as data word lines in a full block mode. FIG. 7 is a flowchart of one embodiment of a process 700 of operating a block in either a sub-block mode or a full-block mode. In an embodiment, the block contains a large number of NAND strings in a three-dimensional memory structure. In one embodiment, the block has three tiers as in, for example, upper tier 421, middle tier 423, and lower tier 425. The reconfigurable group of the word lines may reside within the middle tier. The process 700 may be performed by one or more control circuits (e.g., any one of or any combination of memory controller 120, state machine 262, power control 264, all or a portion of system control logic 260, all or a portion of row control circuitry 220, all or a portion of column control circuitry 210).

Step 702 includes a determination of whether to operate in a sub-block mode or a full-block mode. In one embodiment, a block in the storage system 100 is either operated in the sub-block mode or the full-block mode for an extended period of time. For example, the block could undergo many program/erase cycles in one mode. However, the mode in which a given block is operated may switch between the sub-block mode and the full-block mode. With respect to the blocks in a memory structure 202, it is possible that at a point in time all of the blocks are operated in the full-block mode, all of the blocks are operated in the sub-block mode, or some are operated in the full-block mode and some are operated in the sub-block mode.

Step 704 includes operating a block in a three-dimensional memory structure in a sub-block mode in which a reconfigurable group of word lines are used as dummy word lines that provide electrical isolation between an upper sub-block and a lower sub-block. Step 704 may include erasing the upper sub-block independently of the lower sub-block with the reconfigurable group of word lines providing electrical isolation between the upper sub-block and the lower sub-block. The reconfigurable group of the word lines are not programmed in the sub-block mode.

Step 706 includes operating a block in the three-dimensional memory structure in a full-block mode in which a reconfigurable group of word lines are used as data word lines. Step 704 may include erasing the entire block together. For example, memory cells connected to data word lines WL0-WL267 and memory cells connected to the reconfigurable group of the word lines (e.g., WLRC1, WLRC2, WLRC3 WLRC4) may be erased as a unit. Step 704 may include programming memory cells connected to the reconfigurable group of the word lines.

In some embodiments of process 700, the blocks each have three tiers with a first interface layer (IF1) and a second interface layer (IF2). Also, the lower tier 425 has a dummy WL adjacent IF1, the middle tier 423 has a lower dummy WL adjacent IF1 and an upper dummy WL adjacent IF2, and the upper tier 421 has a dummy WL adjacent IF2. These dummy word lines are operated as dummy WLs in both the sub-block mode (step 704) and the full-block mode (step 706).

FIGS. 8A and 8B will now be referred to in order to discuss advantages of operating in either a sub-block mode or a full-block mode with reconfigurable word lines. FIG. 8A depicts a full-block mode example in which the memory system is provisioned to provide the user with 1 Terabyte (1 Tb) of usable storage. Main blocks 802 represent a sufficient number of blocks operated in the full-block mode to provide 1 Tb of storage. The memory system will also have some extended blocks 804. One use of the extended blocks is to provide for the possibility that some of the main blocks 802 could fail. Some of the main blocks 802 could be determined to be bad blocks during tests in the factory. Some of the main blocks 802 may fail during operation, which are referred to as grown bad blocks. Another possible use of the extended blocks is to account for the use of some blocks as SLC blocks which have a lower storage capacity per block than MLC blocks. Still another possible use of the extended blocks is over-provisioning to account for write amplification. As one example in FIG. 8A, the number of extended blocks 804 total about 10% of the number of main blocks 802.

FIG. 8B depicts an example for a sub-block mode. There may be twice as many sub-blocks as full blocks. However, two of the sub-blocks have slightly less combined storage capacity than a single full block due to the fact that the reconfigurable word lines are not used for data storage in the sub-block mode. Thus, it may take a few more blocks to provide a total user storage of 1 Tb in the sub-block mode. This is indicated by the main sub-blocks 812 being divided into a group of blocks that provide 0.98 Tb and a group providing the remaining 0.02 Tb. Stated another way, the same number of blocks may provide slightly less storage capacity in the sub-block mode than in the full-block mode. For example, the number of blocks that were used in the main blocks 802 in the full-block mode may only provide about 0.98 Tb of user storage in the sub-block mode. This 0.02 Tb shortage may be compensated for by using some of the blocks that could otherwise have been used as the pool of extended sub-blocks. However, this reduces the number of blocks in the pool of extended sub-blocks 814, which may have only about 8% of the number of blocks as the main sub-blocks. However, due to the fact that there may be twice as many sub-blocks as full-blocks, the number of extended sub-blocks 814 may be far greater than the number of extended blocks 804 for the full block mode. For example, there may be about 43 full blocks in the extended blocks 804, but about 68 sub-blocks in the extended sub-blocks 814. This greater number of extended sub-blocks 814 allows for the total storage of the extended sub-blocks 814 to be a smaller percentage of the storage of the main sub-blocks 814 than for the full-block mode.

In one embodiment, the memory controller 120 manages the blocks in the storage system 100 in a full-block mode in which there are x blocks to provide a target storage amount for the user and a half-block mode in which there are more than 2x half-blocks to provide the target storage amount for the user. However, each half-block has less than half the storage capacity of a full block. For example, a full-block mode main pool 802 of x blocks may provide 1 Tb of storage for the user, whereas a half-block mode main pool 812 of 2x+y half-blocks may provide 1 Tb of storage for the user (where y half-blocks account for the, for example, 0.02 Tb deficiency). In this example, x and y are integers greater than 0. Moreover, the memory controller 120 manages an extended block pool in the storage system 100 in both the full-block mode and a half-block mode. The half-block mode extended block pool 814 may have less than twice as many half-blocks as the number of full-blocks in the full-block mode extended block pool 814. However, the half-block mode extended block pool 814 has more half-blocks than there are full blocks in the full-block mode extended block pool 804. For example, there may be p full blocks in the full-block mode extended block pool 804, but p+q half-blocks in the half-block mode extended block pool 814. In this example, p and q are integers greater than 0. This is advantageous because a full block may replace a failing full block in the full block mode main block pool 802; however, a half-block may replace a failing half-block in the half-block mode main block pool 812.

Figure 9:
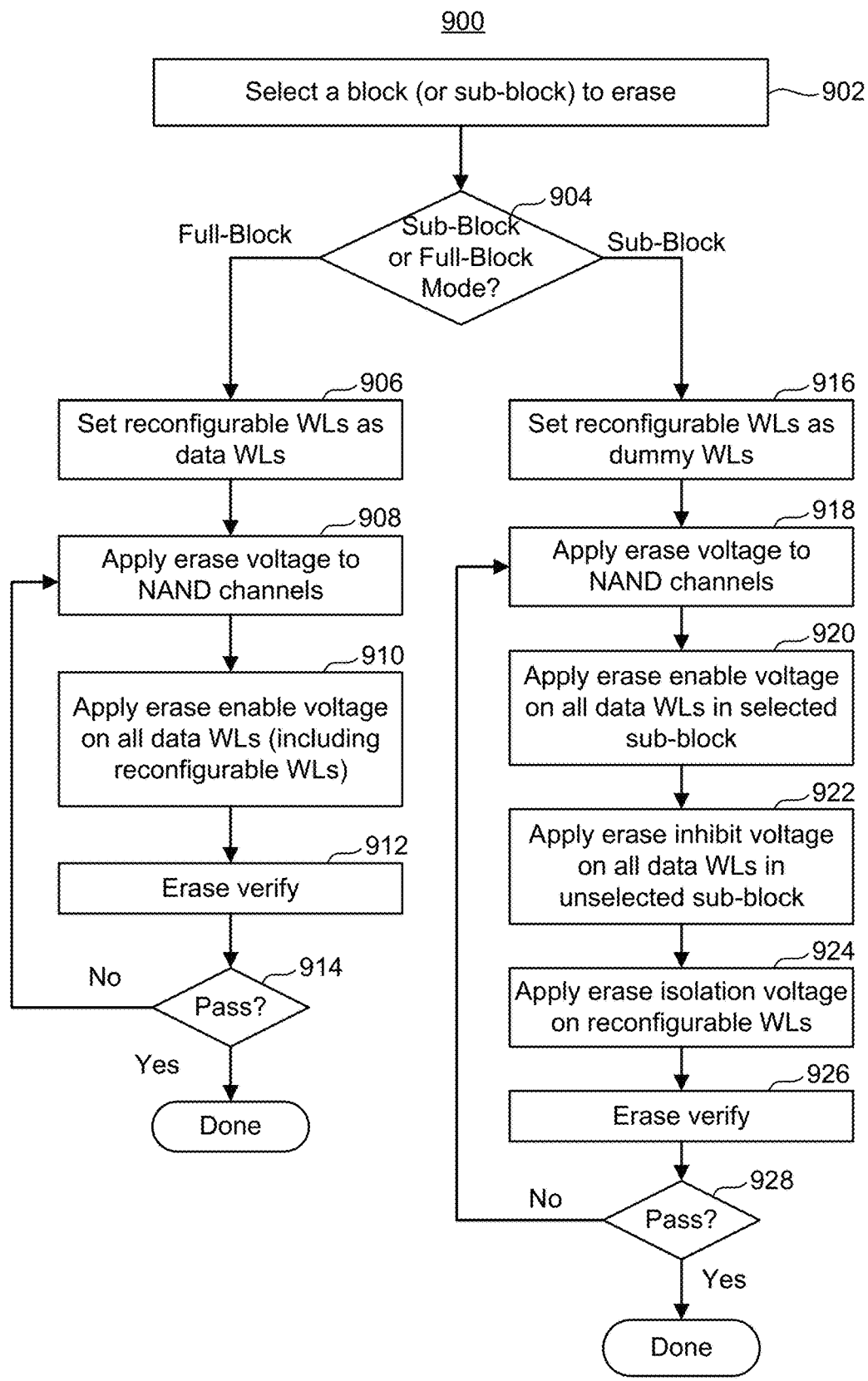
FIG. 9 is a flowchart of one embodiment of a process of erasing NAND in either a sub-block mode or a full-block mode.

FIG. 9 is a flowchart of one embodiment of a process 900 of erasing NAND in either a sub-block mode or a full-block mode. The process 900 may be performed by one or more control circuits. In one embodiment, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage that will erase a memory cell providing that the erase enable voltage is also applied to a different region of that memory cell. An erase enable voltage is defined herein as a voltage that will enable erase of a memory cell providing that the erase voltage is also applied to a different region of that memory cell. A memory cell that has the erase voltage applied to its channel (body) may be inhibited from erase by applying an erase inhibit voltage (e.g., the erase voltage or about 20V) to its control gate. An erase inhibit voltage is defined herein as a voltage that will inhibit erase of a memory cell despite the erase voltage being applied to a different region of that memory cell.

One technique to erase memory cells is to bias a p-well substrate to a high voltage to charge up a NAND channel. An erase enable voltage is applied to control gates of memory cells while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substrate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor, in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

Step 902 includes selecting a block (or sub-block) to erase. Step 904 is a branch depending on whether the erase is for a full-block mode or a sub-block mode. Steps 906-914 describe one embodiment of a full-block erase that are performed in the full-block mode. Step 906 includes setting the reconfigurable WLs as data WLs. In an embodiment, the memory controller 120 set the reconfigurable WLs as data WLs by designated the block for the full-block mode. Note that the block may have already been designated for the full-block mode at a previous time.

Step 908 includes applying the erase voltage to the channels of the NAND strings in the block. Step 910 includes applying the erase enable voltage to all data WLs in the block (including the reconfigurable WLs). Therefore, the voltages applied in steps 908 and 910 will erase the memory cells in the block. Step 912 includes an erase verify.

The erase verify may apply for example VvEr (See FIGS. 5A-5C) to each data WLs in the block (including the reconfigurable WLs). If all memory cells on a NAND string have a Vt below VvEr then the NAND string will conduct a significant current. In some embodiments, if a NAND string passes erase of the NAND string may end at this point. Step 914 is a determination of whether erase is complete. Then steps 908-812 are repeated. Optionally, the magnitude of the erase voltage may be increased each iteration. When all NAND strings have passed erase the process ends. In some embodiments, erase may end with a few NAND strings having yet to pass erase. Steps 908-912 are performed in one embodiment of step 706 of process 700.

Steps 916-928 describe one embodiment of a sub-block erase that are performed in the sub-block mode. Step 916 includes setting the reconfigurable WLs as dummy WLs. In an embodiment, the memory controller 120 set the reconfigurable WLs as dummy WLs by designated the block for the sub-block mode. Note that the block may have already been designated for the sub-block mode at a previous time.

Step 918 includes applying the erase voltage to the channels of the NAND strings in the block. Step 920 includes applying the erase enable voltage to all data WLs in the selected sub-block. Step 922 includes applying the erase inhibit voltage on all data WLs in the unselected sub-block. Step 924 includes applying an erase isolation voltage on all the reconfigurable WLs. The erase isolation voltage has a magnitude that is between the erase enable voltage and the erase inhibit voltage. The erase isolation voltage could be about midway between the erase enable voltage and the erase inhibit voltage. In one embodiment, the erase isolation voltage is about 8V less than the erase voltage (e.g., 20V-8V=12V). Therefore, the voltages applied in steps 908-924 will erase the memory cells in the selected sub-block, while preventing erase of any memory cells in the unselected sub-block. Step 926 includes an erase verify. The erase verify voltage (e.g., VvEr) may be applied to each data WLs in the selected sub-block. A read pass voltage may be applied to each data WLs in the unselected sub-block. The read pass voltage is higher than the Vt of the highest data state such that the read pass voltage will be higher than the Vt of any of the memory cells in the unselected sub-block. If all memory cells on the portion of the NAND string in the selected sub-block have a Vt below VvEr then the NAND string will conduct a significant current. In some embodiments, if a NAND string passes erase of the NAND string may end at this point. Optionally, the magnitude of the erase voltage may be increased and then steps 918-926 are repeated if erase has not yet passed (step 928=no). When all NAND strings in the selected sub-block have passed erase (step 928=yea) the process ends. In some embodiments, erase may end with a few NAND strings having yet to pass erase. Steps 918-926 are performed in one embodiment of step 704 of process 700.

Figure 10:
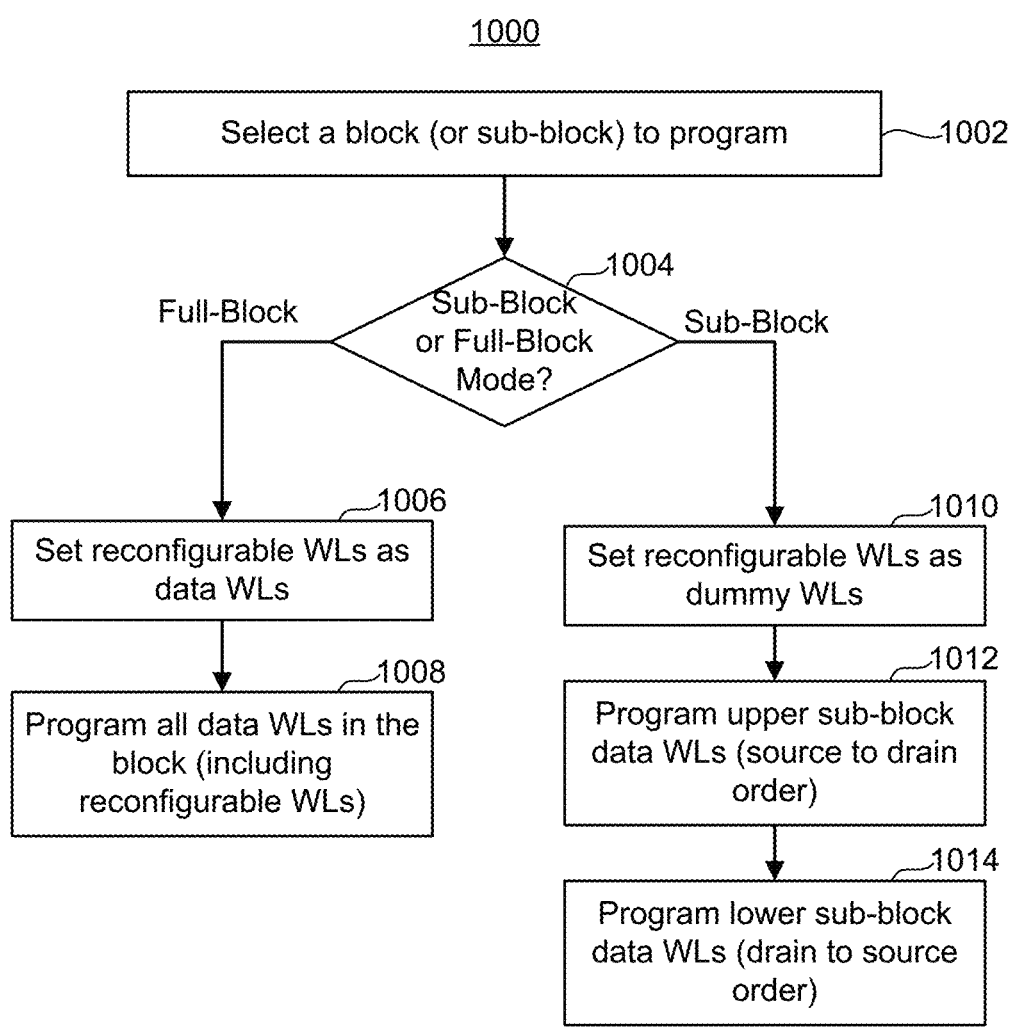
FIG. 10 is a flowchart of one embodiment of a process of programming NAND cells in either a sub-block mode or a full-block mode.

FIG. 10 is a flowchart of one embodiment of a process 1000 of programming NAND cells in either a sub-block mode or a full-block mode. The process 1000 may be performed by one or more control circuits. The process 1000 may be used for SLC or MLC programming. Step 1002 includes selecting a block (or sub-block) to program. Step 1004 is a branch depending on whether the program is for a full-block mode or a sub-block mode. In this is a full-block program, then step 1006 includes setting the reconfigurable WLs as data WLs. In an embodiment, the memory controller 120 set the reconfigurable WLs as data WLs by designated the block for the full-block mode. Note that the block may have already been designated for the full-block mode at a previous time.

Step 1008 includes programming all data WLs (including the reconfigurable WLs). The phrase "program a data WL" means to program the data memory cells connected to the data WL to their respective target data states. The data WLs may be programmed one WL at a time using the process in FIG. 6. The data WLs may be programmed sequentially from either the drain to source of the NAND strings, or from source to drain of the NAND strings. Step 1008 is performed in one embodiment of step 704 of process 700.

If this is a sub-block program, then step 1010 includes setting the reconfigurable WLs as dummy WLs. In an embodiment, the memory controller 120 sets the reconfigurable WLs as dummy WLs by designating the block for the sub-block mode. Note that the block may have already been designated for the sub-block mode at a previous time.

Step 1012 includes programming all data WLs in the upper sub-block. The data WLs may be programmed one WL at a time using the process in FIG. 6. The data WLs in the upper sub-block may be programmed sequentially in a source to drain order. For example, the upper sub-block may be programmed from WL134 to WL267.

Step 1014 includes programming all data WLs in the lower sub-block. The data WLs may be programmed one WL at a time using the process in FIG. 6. The data WLs in the lower sub-block may be programmed sequentially in a drain to source order. For example, the lower sub-block may be programmed from WL133 to WL0. Steps 1012 and 1014 are performed in one embodiment of step 706 of process 700.

Figure 11A:
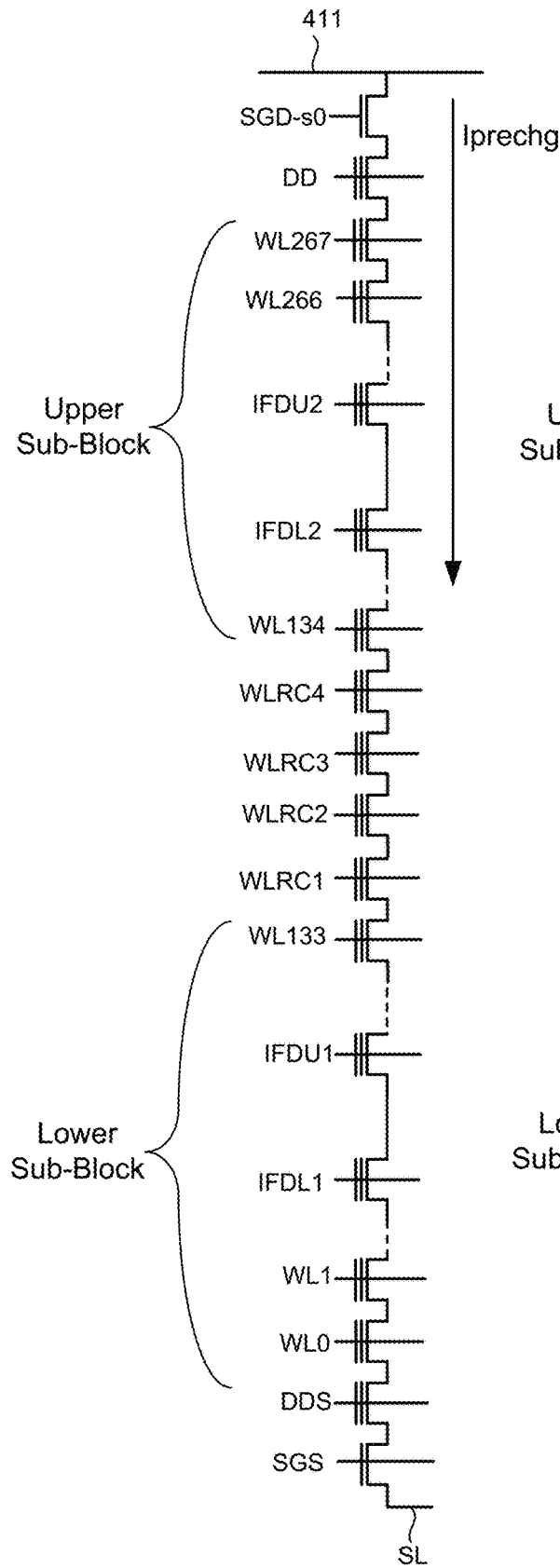
FIG. 11A shows a NAND string being pre-charged during programing of an upper sub-block.

As was discussed in connection with step 604 in FIG. 6, programming memory cells may have a channel pre-charge. In some embodiments, the direction in which the channel is pre-charged in the sub-block mode depends on whether the upper or lower sub-block is being programed. FIG. 11A shows a NAND string being pre-charged during programing of an upper sub-block. FIG. 11A shows an example NAND string connected at a drain end to a bit line 411 and connected at a source end to a source line (SL). FIG. 11A shows that, when programming the upper sub-block, the NAND channel is pre-charged by Iprecgh from the bit line. Also, in an embodiment, the word lines in the upper sub-block are programmed sequentially from WL134 to WL267. Therefore, when programming memory cells connected to a selected word line in the upper sub-block the memory cells connected to word lines between the selected word line and the bit line will still be in the erased state, which facilitates the channel pre-charge.

Figure 11B:
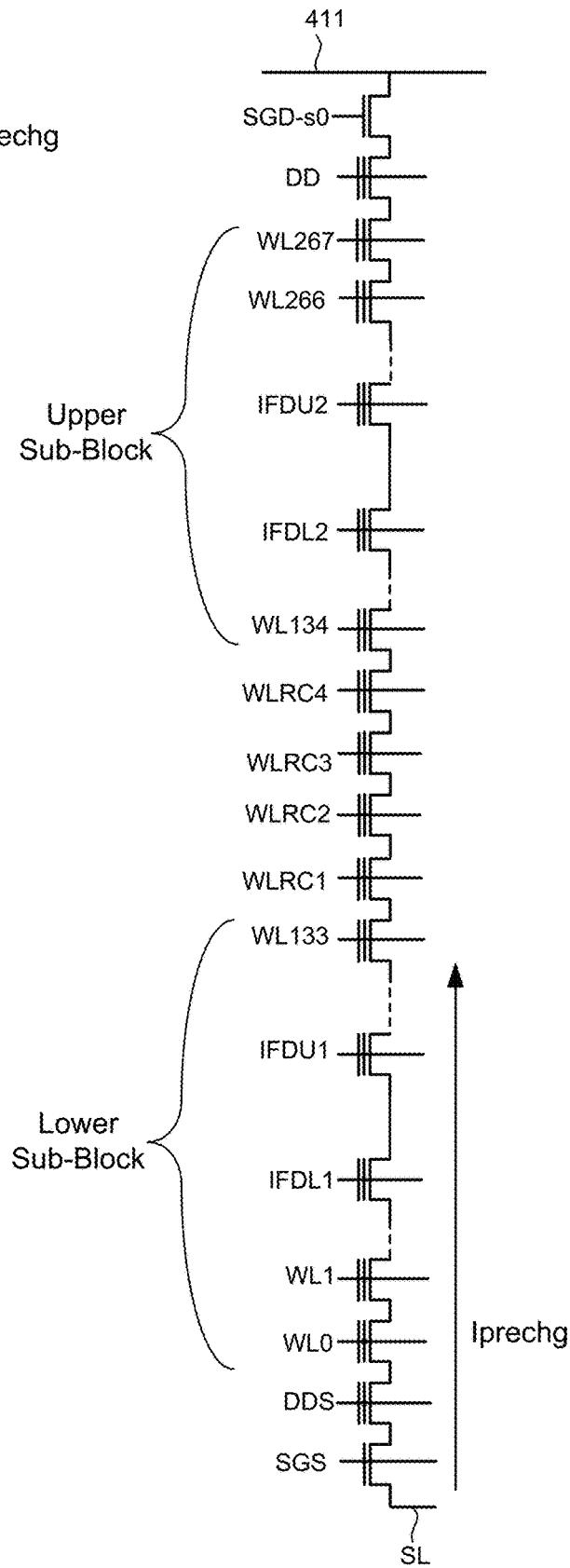
FIG. 11B shows a NAND string being pre-charged during programing of a lower sub-block.

FIG. 11B shows a NAND string being pre-charged during programing of a lower sub-block. FIG. 11B shows that, when programming the lower sub-block, the NAND channel is pre-charged by Iprecgh from the source line. Also, in an embodiment, the word lines in the lower sub-block are programmed sequentially from WL133 to WL0. Therefore, when programming memory cells connected to a selected word line in the lower sub-block the memory cells connected to word lines between the selected word line and the source line will still be in the erased state, which facilitates the channel pre-charge.

In one embodiment of a full-block mode the NAND channels are pre-charged in the direction depicted in FIG. 11A and the word lines are programmed in the order from WL0 to WL267. In one embodiment of a full-block mode the NAND channels are pre-charged in the direction depicted in FIG. 11B and the word lines are programmed in the order from WL267 to WL0.

One issue to note that if the blocks were to be operated in a three sub-block mode with three sub-blocks corresponding to the three tiers there may be a technical challenge to properly pre-charge the NAND channels in the middle sub-block. For example, if memory cells in the upper tier are programmed, there may be a technical challenge in pre-charging the NAND channels from the bit line. Likewise, if memory cells in the lower tier are programmed, there may be a technical challenge in pre-charging the NAND channels from the source line. Thus, if both the upper tier and lower tier are programmed, then pre-charging the NAND channels when programming the middle tier presents a technical challenge. Therefore, using two sub-blocks helps to overcome this technical challenge. However, when dividing a three tier block into two sub-blocks the dummy WLs adjacent to the interface layers (IFDL1, IFDU1, IFDL1, IFDU1) are not in the proper location to provide electrical isolation between the upper sub-block and the lower sub-block. The reconfigurable word lines may provide electrical isolation between the upper sub-block and the lower sub-block when in sub-block mode. Moreover, the reconfigurable word lines may be operated as data word lines in the full-block mode to increase the storage capacity for the full-block mode. Furthermore, because the sub-blocks in the sub-block extended pool 814 may be greater in number than the full-blocks in the full-block extended pool 804, the storage system 100 may be provisioned with fewer blocks and still meet user storage requirements in both the full-block mode and the sub-block mode.

FIG. 12 depicts a table 1200 describing biasing conditions applied to word lines during programming in one embodiment of a sub-block mode. The table 1200 lists example biasing conditions for eight different word lines that are programmed at different times (WL0, WL89, WL90, WL133, WL134, WL177, WL178, and WL267). In one embodiment WL0-WL133 are within the lower sub-block. In one embodiment WL134-WL257 are within the upper sub-block. The table 1200 describes a three tier structure consistent with examples in FIGS. 4D and 4F.

As depicted in table 1200, when programming memory cells in the lower sub-block connected to word line WL0, VPGM (e.g., 12V to 20V) is applied to WL0 while boosting voltages (e.g., Vpass1, Vpass2, Vpass3) are applied to unselected word lines WL1 through WL267. Boosting voltages are also applied to the reconfigurable word lines (WL_RC1, WL_RC2, WL_RC3, and WL_RC4), which are operated as dummy word lines. The boosting voltages will increase the potential of inhibited NAND strings. An inhibited NAND string is one for which the memory cell connected to the word line to which the program voltage is applied is to be inhibited from programming. The channels of inhibited NAND strings are floating; therefore, the boosting voltages will couple up the channel potential thereby inhibiting programming of the memory cell connected to the word line to which the program voltage is applied. Biasing conditions may be similar when programming memory cells connected to other word lines.

FIG. 13A is a flowchart of one embodiment of a process 1300 of programming memory cells in an upper sub-block. The process 1300 may be performed by one or more control circuits. Step 1302 includes setting the selected word line to WL134. Step 1304 includes pre-charging the NAND channels from the bit line (see FIG. 11A). Step 1306 includes applying a boosting voltage (e.g., Vpass) to unselected WLs. Step 1308 includes applying a boosting voltage (e.g., Vpass)

to the reconfigurable WLs. The boosting voltages an have different magnitudes depending on their locations relative to the selected WL. For example, with reference to FIG. 12, Vpass3 may be used for word lines adjacent to the selected word line, Vpass2 may be used for other word line between the selected word line and the bit line, and Vpass1 may be used for other word lines between the selected word line and the source line. Step 1310 includes applying a program pulse to the selected WL. The voltages are applied to the various WLs in 1306-1310 at the same time. Step 1312 is a determination of whether programming of the selected WL is complete. Step 1312 includes a verify step as described in FIG. 6. Steps 1304-1310 are repeated until programming of the selected WL is complete. Step 1314 is a determination of whether there is another WL in the upper sub-block to program. If so, the number of the selected WL is incremented in step 1316. Then, steps 1304-1312 are repeated for this selected WL. The process ends when all data word lines in the upper sub-block have been programmed. Note that process 1300 is described using example number of word lines FIGS. 4D and 4F, but other numbers of word lines in the sub-blocks are contemplated.

Figure 13B:
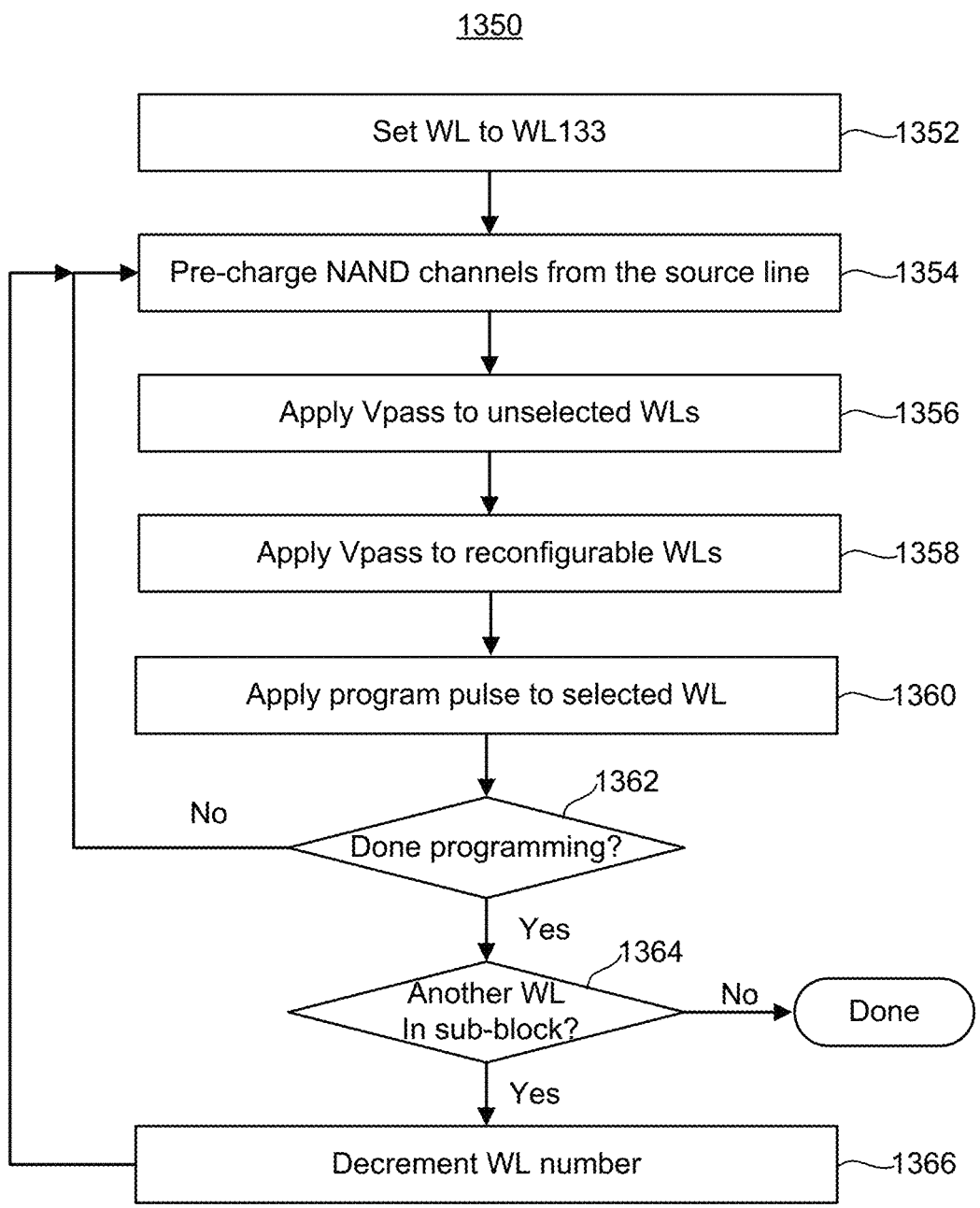
FIG. 13B is a flowchart of one embodiment of a process of programming memory cells in a lower sub-block.

FIG. 13B is a flowchart of one embodiment of a process 1350 of programming memory cells in a lower sub-block. The process 1350 may be performed by one or more control circuits. Step 1352 includes setting the selected word line to WL133. Step 1354 includes pre-charging the NAND channels from the source line (see FIG. 11B). Step 1356 includes applying a boosting voltage (e.g., Vpass) to unselected WLs. Step 1358 includes applying a boosting voltage (e.g., Vpass) to the reconfigurable WLs. Step 1360 includes applying a program pulse to the selected WL. The voltages are applied to the various WLs in 1356-1360 at the same time. Step 1362 is a determination of whether programming of the selected WL is complete. Step 1362 includes a verify step as described in FIG. 6. Steps 1354-1360 are repeated until programming of the selected WL is complete. Step 1364 is a determination of whether there is another WL in the lower sub-block to program. If so, the number of the selected WL is decremented in step 1366. Then, steps 1354-1362 are repeated for this selected WL. The process ends when all data word lines in the lower sub-block have been programmed. Note that process 1350 is described using example number of word lines FIGS. 4D and 4F, but other numbers of word lines in the sub-blocks are contemplated.

FIG. 14A is a flowchart of one embodiment of a process 1400 of programming memory cells in a full-block mode. The process 1400 may be performed by one or more control circuits. Step 1402 includes setting the selected word line to WL0. Step 1404 includes pre-charging the NAND channels from the bit line. Step 1406 includes applying a boosting voltage (e.g., Vpass) to unselected data WLs. Step 1408 includes applying a boosting voltage (e.g., Vpass) to the reconfigurable WLs that are not presently selected. That is, the boosting voltage is not applied to a reconfigurable WL when it is the selected word line. The boosting voltages may have different magnitudes depending on their locations relative to the selected W similar to the scheme in FIG. 12. For example, Vpass3 may be used for word lines adjacent to the selected word line, Vpass2 may be used for other word lines between the selected word line and the bit line, and Vpass1 may be used for other word lines between the selected word line and the source line. Step 1410 includes applying a program pulse to the selected WL. The voltages are applied to the various WLs in 1406-1410 at the same time. Step 1412 is a determination of whether programming of the selected WL is complete. Step 1412 includes a verify step as described in FIG. 6. Steps 1404-1410 are repeated until programming of the selected WL is complete. Step 1414 is a determination of whether there is another WL in the block to program. If so, selected WL is set to the next WL in sequence in step 1416. In an embodiment, the sequence goes from WL0 to WL133, then the reconfigurable WLs, then WL134 to WL267. Then, steps 1404-1412 are repeated for this selected WL. The process ends when all word lines in the block have been programmed. Note that process 1400 is described using example number of word lines FIGS. 4D and 4F, but other numbers of word lines in the sub-blocks are contemplated.

Figure 14B:
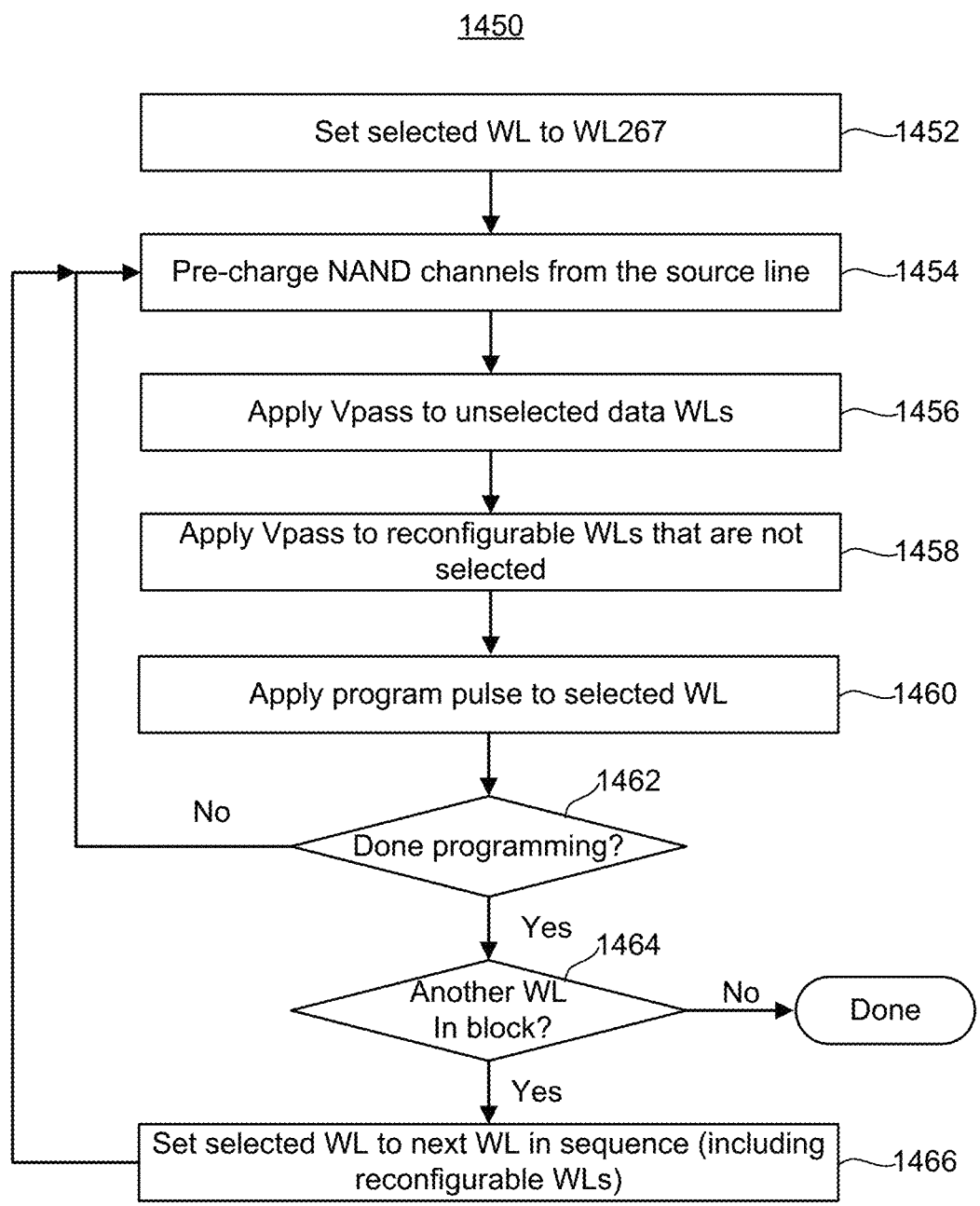

FIG. 14B is a flowchart of one embodiment of a process 1450 of programming memory cells in a full-block mode. The process 1450 may be performed by one or more control circuits. Step 1452 includes setting the selected word line to WL0. Step 1454 includes pre-charging the NAND channels from the source line. Step 1456 includes applying a boosting voltage (e.g., Vpass) to unselected data WLs. Step 1458 includes applying a boosting voltage (e.g., Vpass) to the reconfigurable WLs that are not presently selected. Step 1460 includes applying a program pulse to the selected WL. The voltages are applied to the various WLs in 1456-1460 at the same time. Step 1462 is a determination of whether programming of the selected WL is complete. Steps 1454-1460 are repeated until programming of the selected WL is complete. Step 1464 is a determination of whether there is another WL in the block to program. If so, selected WL is set to the next WL in sequence in step 1466. In an embodiment, the sequence goes from WL267 to WL134, then the reconfigurable WLs, then WL133 to WL0. Then, steps 1454-1462 are repeated for this selected WL. The process ends when all word lines in the block have been programmed. Note that process 1450 is described using example number of word lines FIGS. 4D and 4F, but other numbers of word lines in the sub-blocks are contemplated.

In view of the foregoing, a first embodiment includes an apparatus one or more three-dimensional memory structures. Each three-dimensional memory structure comprises blocks having word lines and NAND strings. The NAND strings in a block comprise memory cells connected to the word lines of the block. The word lines comprise a first set of data word lines in a first region of the block, a second set of data word lines in a second region of the block and reconfigurable word lines between the first set and the second set. The apparatus comprises one or more control circuits in communication with the one or more memory structures. The one or more control circuits are configured to operate a first block in a sub-block mode in which the reconfigurable word lines in the first block are used as dummy word lines that provide electrical isolation between the first region and the second region in the first block. The first region comprises an upper sub-block and the second region comprises a lower sub-block in the sub-block mode. The one or more control circuits are configured to operate a second block in the memory structure in a full-block mode in which the reconfigurable word lines in the second block are used as data word lines.

In a second embodiment, in furtherance to the first embodiment, the one or more control circuits are further configured to operate memory cells connected to the reconfigurable word lines in the first block as dummy memory cells in the sub-block mode that not programmed. The one or more control circuits are further configured to operate memory cells connected to the reconfigurable word lines in the second block as data memory cells in the full-block mode that are programmed.

In a third embodiment, in furtherance to the first or second embodiments, each block comprises an upper tier, a middle tier, and a lower tier. Each block comprises a first interface layer between the lower tier and the middle tier and a second interface layer between the middle tier and the upper tier. The lower tier comprises a dummy word line adjacent to the first interface layer, the middle tier comprises a lower dummy word line adjacent to the first interface layer, the middle tier comprises an upper dummy word line adjacent to the second interface layer, and the upper tier comprises a dummy word line adjacent to the second interface layer. The reconfigurable word lines reside within the middle tier with a first plurality of data word lines of the first set of the data word lines between the reconfigurable word lines and the lower dummy word line of the middle tier and a second plurality of data word lines of the second set of the data word lines between the reconfigurable word lines and the upper dummy word line of the middle tier.

In a fourth embodiment, in furtherance to any of the first to third embodiments, the one or more control circuits are configured to erase first memory cells connected to the first set of data word lines and second memory cells connected to the second set of data word lines in the first block independently when in the sub-block mode, including operate the reconfigurable word lines as dummy word lines in the sub-block mode to provide electrical isolation between the first set and the second set of the data word lines during erase of the first memory cells and during erase of the second memory cells. The one or more control circuits are configured to erase memory cells connected to both the first set and the second set of the data word lines in the second block and memory cells connected to the reconfigurable word lines in the second block as a unit when in the full-block mode.

In a fifth embodiment, in furtherance the any of the fourth embodiment, the one or more control circuits are configured to perform the following in the sub-block mode: apply an erase voltage to channels of the NAND strings of the first block; apply an erase enable voltage to the data word lines in a selected sub-block of the first block, wherein the selected sub-block contains either the lower sub-block or the upper sub-block; apply an erase inhibit voltage to the data word lines in an unselected sub-block of the first block, wherein the unselected sub-block contains the other of the lower sub-block or the upper sub-block; and apply an erase isolation voltage to the reconfigurable word lines in the first block to provide electrical isolation between the selected sub-block and the unselected sub-block, wherein the erase isolation voltage has a magnitude between the erase enable voltage and the erase inhibit voltage.

In a sixth embodiment, in furtherance the fifth embodiment, the one or more control circuits are further configured to perform the following in the full-block mode: apply the erase voltage to channels of the NAND strings of the second block; and apply the erase enable voltage to the first set and the second set of the data word lines in the second block and to the reconfigurable word lines in the second block.

In a seventh embodiment, in furtherance the any of the first to sixth embodiments, the one or more control circuits are further configured to operate the second block in the sub-block mode in which the reconfigurable word lines are used as dummy word lines that provide electrical isolation between the first set of data word lines and the second set of data word lines in the second block.

In an eighth embodiment, in furtherance to any of the first to seventh embodiments, the first block is associated with a plurality of bit lines and one or more source lines. The one or more control circuits are further configured to pre-charge channels of NAND strings in the first block from the bit lines when programming an upper sub-block in the sub-block mode. The one or more control circuits are further configured to pre-charge the channels of the NAND strings in the first block from the one or more source lines when programming a lower sub-block in the sub-block mode.

In a ninth embodiment, in furtherance to the eighth embodiment, the one or more control circuits are further configured to program the first set of data word lines in a drain to source order in the sub-block mode, wherein the first set of data word lines reside in the lower sub-block. The one or more control circuits are further configured to program the second set of data word lines in a source to drain order in the sub-block mode, wherein the second set of data word lines reside in the upper sub-block.

In a tenth embodiment, in furtherance to any of the first to ninth embodiments, the one or more control circuits are further configured to apply boosting voltages to the reconfigurable word lines in the first block while applying a programming voltage to a selected word line in the first block in the sub-block mode.

In an eleventh embodiment, in furtherance to any of the first to tenth embodiments, the one or more control circuits are further configured to manage a full-block main block pool having x full-blocks in the full-block mode, wherein the x full-blocks provide a target storage amount. The one or more control circuits are further configured to manage a half-block main block pool having 2x+y sub-blocks in the sub-block mode, wherein x and y are integers greater than 0, wherein the 2x+y sub-blocks provide the target storage amount.

In a twelfth embodiment, in furtherance to the eleventh embodiment, the one or more control circuits are further configured to manage a full-block extended block pool having p full-blocks in the full-block mode. The x full-blocks and the p full-blocks comprise all blocks in the one or more memory structures. The one or more control circuits are further configured to manage a half-block extended block pool having p+q sub-blocks in the sub-block mode, wherein p and q are integers greater than 0. The 2x+y sub-blocks and the p+q sub-blocks comprise all blocks in the one or more memory structures.

One embodiment includes a method for operating a non-volatile storage system. The method comprises operating a block having NAND strings and word lines in a half NAND string mode in which a group of word lines in the block provide electrical isolation between a first set of data word lines connected to memory cells on a bottom section of the NAND strings and a second set of data word lines connected to memory cells on a top section of the NAND strings, including erasing the memory cells connected to the first set of data word lines independent of erasing the memory cells connected to the second set of data word lines while biasing the group of the word lines to provide electrical isolation between the first set and the second set of data word lines. The method comprises operating the block in a full NAND string mode, including erasing the memory cells connected to the first set of data word lines, the memory cells connected to the second set of data word lines, and memory cells connected to the group of the word lines as a unit.

One embodiment includes a non-volatile storage system. The system comprises a one or more three-dimensional memory structures, wherein each memory structure comprises blocks having word lines and NAND strings. The NAND strings in a block comprise memory cells connected to the word lines of the block. Each block comprises three tiers with each tier comprising a different section of each NAND string, wherein the three tiers include a lower tier, a middle tier, and an upper tier. Each block comprises a first interface layer having first fabrication joints and a second interface layer having second fabrication joints. The first fabrication joints are configured to electrically connect channels of sections of respective NAND strings in the lower tier to corresponding channels of sections of respective NAND strings in the middle tier. The second fabrication joints are configured to electrically connect channels of sections of respective NAND strings in the middle tier to corresponding channels of sections of respective NAND strings in the upper tier. The system comprises means for operating the one or more memory structures in a half-block mode in which a group of the word lines in the middle tier are used as dummy word lines. Memory cells connected to the group are not programmed in the sub-block mode. A first plurality of data word lines reside between the group and the first fabrication joints and a second plurality of data word lines reside between the group and the second fabrication joints. The system comprises means for operating the one or more memory structures in a full-block mode in which the group in the middle tier are used as data word lines, wherein the memory cells connected to the group are programmed in the full-block mode.

In an embodiment, the means for operating the one or more three-dimensional memory structures in a half-block mode comprises one or more of memory controller 120, system control logic 206, state machine 262, column control circuitry 210, row control circuitry 220, a processor, an FPGA, an ASIC, and/or an integrated circuit. In an embodiment, the means for operating the one or more three-dimensional memory structures in a half-block mode performs steps 916-926 of process 900. In an embodiment, the means for operating the one or more three-dimensional memory structures in a half-block mode performs steps 1010-1014 of process 1000. In an embodiment, the means for operating the one or more three-dimensional memory structures in a half-block mode performs process 1300. In an embodiment, the means for operating the one or more three-dimensional memory structures in a half-block mode performs process 1350.

In an embodiment, the means for operating the memory structure in a full-block mode comprises one or more of memory controller 120, system control logic 206, state machine 262, column control circuitry 210, row control circuitry 220, a processor, an FPGA, an ASIC, and/or an integrated circuit. In an embodiment, the means for operating the one or more three-dimensional memory structures in a full-block mode performs steps 906-912 of process 900. In an embodiment, the means for operating the one or more three-dimensional memory structures in a sub-block mode performs steps 1006-1008 of process 1000. In an embodiment, the means for operating the one or more three-dimensional memory structures in a full-block mode performs process 1400. In an embodiment, the means for operating the one or more three-dimensional memory structures in a full-block mode performs process 1450.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more three-dimensional memory structures, each comprising blocks having word lines and NAND strings, wherein the NAND strings in a block comprise memory cells connected to the word lines of the block, wherein the word lines comprise a first set of data word lines in a first region of the block, a second set of data word lines in a second region of the block and reconfigurable word lines between the first set and the second set; and
one or more control circuits in communication with the one or more memory structures, wherein the one or more control circuits are configured to:
operate a first block in a sub-block mode in which the reconfigurable word lines in the first block are used as dummy word lines that provide electrical isolation between the first region and the second region in the first block, wherein the first region comprises an upper sub-block and the second region comprises a lower sub-block in the sub-block mode; and
operate a second block in a full-block mode in which the reconfigurable word lines in the second block are used as data word lines.

2. The apparatus of claim 1, wherein the one or more control circuits are configured to:
operate memory cells connected to the reconfigurable word lines in the first block as dummy memory cells in the sub-block mode that not programmed; and
operate memory cells connected to the reconfigurable word lines in the second block as data memory cells in the full-block mode that are programmed.

3. The apparatus of claim 1, wherein:
each block comprises an upper tier, a middle tier, and a lower tier;
each block comprises a first interface layer between the lower tier and the middle tier and a second interface layer between the middle tier and the upper tier;
the lower tier comprises a dummy word line adjacent to the first interface layer, the middle tier comprises a lower dummy word line adjacent to the first interface layer, the middle tier comprises an upper dummy word line adjacent to the second interface layer, and the upper tier comprises a dummy word line adjacent to the second interface layer; and the reconfigurable word lines reside within the middle tier with a first plurality of data word lines of the first set of the data word lines between the reconfigurable word lines and the lower dummy word line of the middle tier and a second plurality of data word lines of the second set of the data word lines between the reconfigurable word lines and the upper dummy word line of the middle tier.

4. The apparatus of claim 1, wherein the one or more control circuits are configured to:

erase first memory cells connected to the first set of data word lines and second memory cells connected to the second set of data word lines in the first block independently when in the sub-block mode, including operate the reconfigurable word lines as dummy word lines in the sub-block mode to provide electrical isolation between the first set and the second set of the data word lines during erase of the first memory cells and during erase of the second memory cells; and erase memory cells connected to both the first set and the second set of the data word lines in the second block and memory cells connected to the reconfigurable word lines in the second block as a unit when in the full-block mode.

5. The apparatus of claim 4, wherein the one or more control circuits are configured to perform the following in the sub-block mode:

apply an erase voltage to channels of the NAND strings of the first block;

apply an erase enable voltage to the data word lines in a selected sub-block of the first block, wherein the selected sub-block contains either the lower sub-block or the upper sub-block;

apply an erase inhibit voltage to the data word lines in an unselected sub-block of the first block, wherein the unselected sub-block contains the other of the lower sub-block or the upper sub-block; and apply an erase isolation voltage to the reconfigurable word lines in the first block to provide electrical isolation between the selected sub-block and the unselected sub-block, wherein the erase isolation voltage has a magnitude between the erase enable voltage and the erase inhibit voltage.

6. The apparatus of claim 5, wherein the one or more control circuits are further configured to perform the following in the full-block mode:

apply the erase voltage to channels of the NAND strings of the second block; and apply the erase enable voltage to the first set and the second set of the data word lines in the second block and to the reconfigurable word lines in the second block.

7. The apparatus of claim 1, wherein the one or more control circuits are further configured to:

operate the second block in the sub-block mode in which the reconfigurable word lines are used as dummy word lines that provide electrical isolation between the first set of data word lines and the second set of data word lines in the second block.

8. The apparatus of claim 1, wherein:

the first block is associated with a plurality of bit lines and one or more source lines;

the one or more control circuits are further configured to pre-charge channels of NAND strings in the first block from the bit lines when programming the upper sub-block in the sub-block mode; and the one or more control circuits are further configured to pre-charge the channels of the NAND strings in the first block from the one or more source lines when programming the lower sub-block in the sub-block mode.

9. The apparatus of claim 8, wherein the one or more control circuits are further configured to:

program the first set of data word lines in a drain to source order in the sub-block mode, wherein the first set of data word lines reside in the lower sub-block; and program the second set of data word lines in a source to drain order in the sub-block mode, wherein the second set of data word lines reside in the upper sub-block.

10. The apparatus of claim 1, wherein the one or more control circuits are further configured to:

apply boosting voltages to the reconfigurable word lines in the first block while applying a programming voltage to a selected word line in the first block in the sub-block mode.

11. The apparatus of claim 1, wherein the one or more control circuits are further configured to:

manage a full-block main block pool having x full-blocks in the full-block mode, wherein the x full-blocks provide a target storage amount; and manage a half-block main block pool having 2x+y sub-blocks in the sub-block mode, wherein x and y are integers greater than 0, wherein the 2x+y sub-blocks provide the target storage amount.

12. The apparatus of claim 11, wherein the one or more control circuits are further configured to:

manage a full-block extended block pool having p full-blocks in the full-block mode, wherein the x full-blocks and the p full-blocks comprise all blocks in the one or more memory structures; and manage a half-block extended block pool having p+q sub-blocks in the sub-block mode, wherein p and q are integers greater than 0, wherein the 2x+y sub-blocks and the p+q sub-blocks comprise all blocks in the one or more memory structures.

13. A method for operating a non-volatile storage system, the method comprising:

operating a block having NAND strings and word lines in a half NAND string mode in which a group of word lines in the block provide electrical isolation between a first set of data word lines connected to memory cells on a bottom section of the NAND strings and a second set of data word lines connected to memory cells on a top section of the NAND strings, including:

erasing the memory cells connected to the first set of data word lines independent of erasing the memory cells connected to the second set of data word lines while biasing the group of the word lines to provide electrical isolation between the first set and the second set of data word lines; and operating the group of the word lines in the half NAND string mode as dummy word lines that are not programmed with data; and operating the block in a full NAND string mode, including:

erasing the memory cells connected to the first set of data word lines, the memory cells connected to the second set of data word lines, and memory cells connected to the group of the word lines as a unit; and programming user data into the memory cells connected to the group of the word lines in the full NAND string mode.

14. The method of claim 13, wherein erasing the memory cells connected to the first set of data word lines, the memory cells connected to the second set of data word lines, and the memory cells connected to the group of the word lines as a unit comprises:

applying an erase enable voltage to the group of the word lines while applying an erase voltage to channels of the NAND strings.

15. The method of claim 13, wherein the block comprises an upper tier, a middle tier, and a lower tier, wherein each tier contains a different section of each NAND string in the block, wherein the group of the word lines resides in the middle tier, the block comprises a first interface layer between the lower tier and the middle tier and a second interface layer between the middle tier and the upper tier, the lower tier comprises a first dummy word line adjacent to the first interface layer, the middle tier comprises a second dummy word line adjacent to the first interface layer, the middle tier comprises a third dummy word line adjacent to the second interface layer, the upper tier comprises a fourth dummy word line adjacent to the second interface layer, and further comprising:

operating the first dummy word line, the second dummy word line, the third dummy word line, and the fourth dummy word line as dummy word lines in both the full NAND string mode and the half NAND string mode.

16. A non-volatile storage system comprising:

one or more three-dimensional memory structures, each memory structure comprising blocks having word lines and NAND strings, wherein the NAND strings in a block comprise memory cells connected to the word lines of the block, wherein each block comprises three tiers with each tier comprising a different section of each NAND string, wherein the three tiers include a lower tier, a middle tier, and an upper tier, wherein each block comprises a first interface layer having first fabrication joints and a second interface layer having second fabrication joints, wherein the first fabrication joints are configured to electrically connect channels of sections of respective NAND strings in the lower tier to corresponding channels of sections of respective NAND strings in the middle tier, wherein the second fabrication joints are configured to electrically connect channels of sections of respective NAND strings in the middle tier to corresponding channels of sections of respective NAND strings in the upper tier;

means for operating the one or more three-dimensional memory structures in a half-block mode in which a group of the word lines in the middle tier are used as dummy word lines, wherein memory cells connected to the group are not programmed in the half-block mode, wherein a first plurality of data word lines reside between the group and the first fabrication joints and a second plurality of data word lines reside between the group and the second fabrication joints; and means for operating the one or more three-dimensional memory structures in a full-block mode in which the group in the middle tier are used as data word lines, wherein the memory cells connected to the group are programmed in the full-block mode.

17. The non-volatile storage system of claim 16, wherein the means for operating the one or more three-dimensional memory structures in the half-block mode is configured to:

erase memory cells in an upper half-block and a lower half-block of a particular block independently, including apply an isolation voltage to the group of the word lines while applying an erase voltage to channels of the NAND strings to provide electrical isolation between the lower half-block and the upper half-block.

18. The non-volatile storage system of claim 17, wherein the means for operating the one or more three-dimensional memory structures in the half-block mode is configured to:

erase memory cells in a selected half-block of the upper half-block and the lower half-block while preventing erase in an unselected half-block of the upper half-block and the lower, including:

apply an erase voltage to channels of the NAND strings;

apply an erase enable voltage to the data word lines in the selected half-block;

apply an erase inhibit voltage to the data word lines in an unselected half-block; and apply an isolation voltage to the group of the word lines while the erase voltage, erase enable voltage, and erase inhibit voltages are applied to provide electrical isolation between the selected half-block and the unselected half-block, wherein the isolation voltage has a magnitude between the erase enable voltage and the erase inhibit voltage.

19. The non-volatile storage system of claim 17, wherein the means for operating the one or more three-dimensional memory structures in the full-block mode is configured to:

erase the memory cells in the upper half-block, the memory cells in the lower half-block and memory cells connected to the group of word lines as a unit, including apply an erase enable voltage to the group of the word lines to erase the memory cells connected to the group of word lines.

* * * * *